US010677593B2

(12) United States Patent
McGarry

(10) Patent No.: US 10,677,593 B2
(45) Date of Patent: *Jun. 9, 2020

(54) MACHINE VISION SYSTEM FOR FORMING A DIGITAL REPRESENTATION OF A LOW INFORMATION CONTENT SCENE

(71) Applicant: Cognex Corporation, Natick, MA (US)

(72) Inventor: John McGarry, San Diego, CA (US)

(73) Assignee: Cognex Corporation, Natick, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/169,563

(22) Filed: Oct. 24, 2018

(65) Prior Publication Data

US 2019/0128671 A1    May 2, 2019

Related U.S. Application Data

(63) Continuation of application No. 14/859,178, filed on Sep. 18, 2015, now Pat. No. 10,113,870, which is a continuation-in-part of application No. 13/847,939, filed on Mar. 20, 2013, now Pat. No. 9,453,730.

(51) Int. Cl.
| | |
|---|---|
| *H03M 7/30* | (2006.01) |
| *G01C 11/02* | (2006.01) |
| *H04N 5/335* | (2011.01) |
| *H04N 13/207* | (2018.01) |
| *H04N 13/254* | (2018.01) |

(52) U.S. Cl.
CPC ......... *G01C 11/025* (2013.01); *H03M 7/3059* (2013.01); *H03M 7/3062* (2013.01); *H04N 5/335* (2013.01); *H04N 13/207* (2018.05); *H04N 13/254* (2018.05)

(58) Field of Classification Search
CPC .......................... G01C 11/025; H03M 7/3059
See application file for complete search history.

(56) References Cited

U.S. PATENT DOCUMENTS

| | | | |
|---|---|---|---|
| 5,105,276 A | * | 4/1992 | Schrock ................. H04N 5/361 348/241 |
| 8,199,244 B2 | | 6/2012 | Baraniuk |
| 9,453,730 B2 | | 9/2016 | McGarry |
| 2002/0085107 A1 | | 7/2002 | Chen et al. |

(Continued)

FOREIGN PATENT DOCUMENTS

| | | |
|---|---|---|
| CN | 101287064 A1 | 10/2008 |
| CN | 101291389 A1 | 10/2008 |

(Continued)

OTHER PUBLICATIONS

Dadkhah et al., "Block-Based Compressive Sensing in a CMOS Image Sensor", IEEE Sensors Journal, Jan. 1, 2013, pp. 1-12.

(Continued)

*Primary Examiner* — John R Schnurr
*Assistant Examiner* — Kyle M Lotfi
(74) *Attorney, Agent, or Firm* — Fish & Richardson P.C.

(57) ABSTRACT

A machine vision system to form a digital image that includes information about both (1) relative displacements of segments of an illumination profile within the digital image due to height discontinuities of corresponding illuminated portions of various surfaces in a scene, and (2) relative reflectivity of the illuminated portions of those surfaces.

10 Claims, 17 Drawing Sheets

(56) References Cited

U.S. PATENT DOCUMENTS

| | | |
|---|---|---|
| 2005/0092894 A1 | 5/2005 | Fossum |
| 2010/0073294 A1 | 3/2010 | Kim et al. |
| 2010/0245955 A1 | 9/2010 | Yamakawa et al. |
| 2012/0038786 A1 | 2/2012 | Kelly et al. |
| 2012/0162457 A1 | 6/2012 | Veeraraghavan |
| 2012/0281126 A1 | 11/2012 | Fossum |
| 2013/0119438 A1 | 5/2013 | Kim et al. |
| 2014/0231620 A1 | 4/2014 | Oike et al. |
| 2014/0285625 A1 | 9/2014 | McGarry |
| 2015/0030234 A1 | 1/2015 | Lenseigne et al. |
| 2016/0010990 A1 | 1/2016 | McGarry |

FOREIGN PATENT DOCUMENTS

| | | |
|---|---|---|
| CN | 102708781 | 10/2012 |
| CN | 103548335 A1 | 1/2014 |
| JP | 05-322539 | 12/1993 |
| JP | 2005-354568 | 12/2005 |
| WO | WO2009035785 A1 | 3/2009 |
| WO | WO2012058229 | 5/2012 |
| WO | WO2012132670 A1 | 10/2012 |

OTHER PUBLICATIONS

Nilchi et al., "Focal-Plane Algorithmically-Multiplying CMOS Computational Image Sensor", IEEE Journal of Solid-State Circuits, Jun. 1, 2009, pp. 1829-1839.

Baraniuk et al., "Exponential decay of reconstruction error from binary measurements of sparse signals", arXiv:1407.8246v1 [cs.IT] Aug. 1, 2014, pp. 1-27.

Boufounos et al., "1-Bit Compressive Sensing", Information Sciences and Systems, CISS, 42nd Annual Conference on Mar. 19-21, 2008, pp. 16-21, IEEE.

Candes et al., "Near-Optimal Signal Recovery From Random Projections: Universal Encoding Strategies?", IEEE Transactions on Information Theory, vol. 52, No. 12, Dec. 2006.

Candes et al.,"An Introduction to Compressive Sampling", IEEE Signal Processing Magazine, Mar. 2008, pp. 21-30.

Chinese Application No. 201410103031.X, First Office Action, dated Dec. 5, 2016, 11 pages with translation.

DALSA Technology with Vision, "Application Note, Line Scan Imaging Basics", 03-32-00541-00, pp. 1-11.

David L. Donoho, "Compressed Sensing", IEEE Transactions on Information Theory, vol. 52, No. 4, Apr. 2006, pp. 1289-1306.

Dubois et al., "A 10000 fps CMOS Sensor With Massively Parallel Image Processing", IEEE Journal of Solid State Circuits, Institute of Electrical and Electronics Engineers, vol. 43, No. 3, pp. 706-717, Mar. 2008.

Dubois et al., "VLSI Design of a High-Speed CMOS Image Sensor With In-Situ 2D Programmable Processing", $14^{th}$ European Signal Processing Conference (EUSIPCO 2006), Sep. 2006, 5 pages.

Extended European Search Report, European Patent Application No. 14160933.9, dated Jan. 22, 2015, 9 pages.

Jacques et al., "CMOS Compressed Imaging by Random Convolution", IEEE International Conference on Acoustics, Speech and Signal Processing, 2009, 4 pages.

Jacques et al., "Robust 1-Bit Compressive Sensing via Binary Stable Embeddings of Sparse Vectors", URL: http://arxiv.org/abs/1104.3160v2, pp. 1-40, Feb. 15, 2012.

Japanese Patent Application No. 2016-069680, Notice of Reason for Refusal dated Jan. 23, 2018, 4 pages.

Knudson et al., "One-bit compressive sensing with norm estimation", arXiv:1404.6863v1 [stat.ML], Apr. 28, 2014, pp. 1-15.

Majidzadeh et al., "A (256×256) Pixel 76.7mW CMOS Imager/Compressor Based on Real-Time In-Pixel Compressive Sensing", IEEE 2010, pp. 2956-2959.

Oike et al., "CMOS Image Sensor With Per-Column ADC and Programmable Compressed Sensing", IEEE Journal of Solid-State Circuits, vol. 48, No. 1, Jan. 2013, pp. 318-328.

Japanese Patent Application No. 2014-055305, Notice of Reasons for Refusal, dated Mar. 31, 2015, 9 pages.

International Application No. PCT/US2017/013328, Notification of Transmittal of the International Search Report and the Written Opinion of the International Searching Authority, dated Apr. 7, 2017, 16 pages.

European Application No. 17174525.0, Extended European Search Report, dated Nov. 21, 2017, 9 pages.

Asada and Oike, "High-Definition, Real-Time 3D Imaging System Using the Light-Section Method", Image Lab (Gazo Rabo), vol. 15, No. 7, pp. 40-44, 2004.

Japanese Patent Application No. 2018-109639, Notice of Allowance dated Jan. 21, 2020, 3 pages.

* cited by examiner

MACHINE VISION SYSTEM FOR FORMING A DIGITAL REPRESENTATION OF A LOW INFORMATION CONTENT SCENE

CROSS-REFERENCE TO RELATED APPLICATIONS

This application is a continuation of U.S. patent application Ser. No. 14/859,178, entitled "Machine Vision System for Forming a Digital Representation of a Low Information Content Scene", filed on Sep. 18, 2015, issued as U.S. Pat. No. 10,113,870 on Oct. 30, 2018, which is a continuation-in-part of U.S. patent application Ser. No. 13/847,939, entitled "Machine Vision 3D Line San Image Acquisition and Processing," filed on Mar. 20, 2013, and issued as U.S. Pat. No. 9,453,730 on Sep. 27, 2016, the entire contents of which is hereby incorporated by reference.

BACKGROUND

The present invention relates generally to machine vision, and more particularly to machine vision systems for forming a digital representation of a low information content scene, e.g., a scene that is sparsely illuminated by an illumination plane.

A well-known method for acquiring 3D range images includes steps of: providing a light source with line generating optics to illuminate a single plane of a scene, positioning a digital camera to view the light plane such that objects illuminated by the light source appear in the optical image formed by the camera lens, capturing a digital image of the scene, processing the digital image to extract the image coordinates of points in the scene illuminated by the light source, and processing the image coordinates according to the triangulation geometry of the optical system to form a set of physical coordinates suitable for measurement of objects in the scene.

A major limitation associated with such a conventional machine vision process is that a 2-dimensional intensity image of substantial size must be captured by the digital camera for each and every line of physical coordinates formed by the system. This can make the time to capture the 3D image of a scene as much as 100 times longer than the time required to acquire an intensity image of the same size scene, thereby rendering laser-line based 3D image formation methods too slow for many industrial machine-vision applications.

SUMMARY

Aspects of the invention provide machine vision systems and methods applicable to location of the intersection of a plane(s) of illumination with an object(s) in a scene.

Aspects of the present invention introduce methods and apparatus that make possible the practical realization of a vision system having significant advantages over conventional vision systems in the stated application domain. In some aspects the invention performs substantially the same function as the conventional vision systems of FIG. 1A, and FIG. 1B i.e. to extract parameters associated with the image features of the curve formed of the intersection of a plane of illumination with objects of interest in a physical scene, but performs the functions, including computations, in such a way as to realize a throughput advantage in actual implementation.

In one aspect the invention provides a method useful in determining information of an image, comprising: accumulating a first pixel signal based on incoming light energy for each of a plurality of pixel elements of a pixel array, the pixel elements each including a light sensor, the first pixel signals indicative of an image of a scene; and obtaining information of a measurement indicative of the image of the scene by: applying sets of control signals to rows of the pixel elements, pixel elements of each row sharing common control signals, each of the sets of control signals being substantially uncorrelated with each other, each of the sets of control signals being representative of a different vector of a matrix comprising a product of a random basis function and a filtering function having a frequency response tuned to desired spatial frequencies of interest in an expected image signal, for each set of control signals, aggregating, in accordance with the control signals, output signals based on the first pixel signals for columns of pixel elements, and digitizing each of the aggregated output signals of the columns of the pixel elements.

In accord with some such aspects accumulation of the first pixel signals begins prior to application of the sets of control signals and continues throughout application of the sets of control signals. In accord with some such aspects accumulation of the first pixel signals begins prior to application of the sets of control signals, and application of the sets of control signals temporarily interrupted, and resetting and recommencing accumulation of the first pixel signals occurs during the interruption. In accord with some such aspects aggregating, in accordance with the control signals, output signals based on the first pixel signals for columns of pixel elements, comprises, for each column of pixel elements, coupling first selected ones of the first pixel signals to a first column output line for that column and coupling second selected ones of the first pixel signals to a second column output line for that column, the first selected ones of the first pixel signals and the second selected ones of the first pixel signals being determined by the control signals. In accord with some such aspects digitizing each of the aggregated output signals of the columns of the pixel elements comprises, for each of the columns of the pixel elements, comparing signals of the first column output line and the second column output line. In accord with some such aspects the first pixel signals comprise voltage signals and wherein the output signals comprise current signals. In accord with some such aspects the pixel array includes $N_1$ rows of pixel elements, $N_2$ columns of pixel elements, and M sets of control signals are applied to rows of the pixel elements to form a measurement indicative of the image of the scene, M much less than $N_1$. In accord with some such aspects the filtering function is based on a central difference approximation. In accord with some such aspects the digitized aggregated output signals are written to a buffer, the buffer storing a measurement indicative of the image of the scene. In accord with some such aspects an estimate is determined by forming a product of a transpose of the random basis function and the measurement, the estimate is refined, and edges of lines are located in the estimate.

In another aspect the invention provides a method useful in determining information of an image, comprising: accumulating a first pixel signal based on incoming light energy for each of a plurality of pixel elements of a pixel array, the pixel elements each including a light sensor; and obtaining information of a measurement indicative of the image of the scene by: applying sets of control signals to rows of the pixel elements, pixel elements of each row being grouped in pixel subsets each including a plurality of pixels of that row, pixel elements in each row belonging to each pixel subset sharing common control signals, each of the sets of control signals being substantially uncorrelated with each other, for each set of control signals, aggregating, in accordance with the control signals, output signals of columns of pixel elements, the output signals being based on the first pixel signals, and digitizing each of the aggregated output signals of the columns of the pixel elements.

In accord with some such aspects for each row, pixel elements in a first pixel subset are separated by pixel elements of at least one other pixel subset. In accord with some such aspects each column of pixel elements includes only pixel elements belonging to the same pixel subset. In accord with some such aspects the sets of control signals comprise groups of sets of control signals, each group of sets of control signals based on a different sampling function. In accord with some such aspects each sampling function is substantially uncorrelated to the other sampling functions. In accord with some such aspects pixel elements in each subset receive control signals based on different sampling functions. In accord with some such aspects the control signals are based on at least nine different sampling functions, with control signals based on at least three different sampling functions being applied over a first time period, control signals based on at least three other different sampling functions being applied over a second time period, and control signals based on at least another three other different sampling functions being applied over a third time period. In accord with some such aspects each sampling function comprises a product of a random basis function and a filtering function having a frequency response tuned to desired spatial frequencies of interest in an expected image signal. In accord with some such aspects accumulation of the first pixel signals occurs asynchronously with respect to application of the sets of control signals. In accord with some such aspects accumulation of the first pixel signals occurs synchronously with respect to application of the sets of control signals. In accord with some such aspects aggregating, in accordance with the control signals, output signals based on the first pixel signals for columns of pixel elements, comprises, for each column of pixel elements, coupling first selected ones of the first pixel signals to a first column output line for that column and coupling second selected ones of the first pixel signals to a second column output line for that column, the first selected ones of the first pixel signals and the second selected ones of the first pixel signals being determined by the control signals. In accord with some such aspects digitizing each of the aggregated output signals of the columns of the pixel elements comprises, for each of the columns of the pixel elements, comparing signals of the first column output line and the second column output line. In accord with some such aspects the first pixel signals comprise voltage signals and wherein the output signals comprise current signals. In accord with some such aspects the pixel array includes $N_1$ rows of pixel elements, $N_2$ columns of pixel elements, and M sets of control signals are based on each sampling function, M much less than $N_1$.

In another aspect the invention provides a method useful in determining information of an image, comprising: providing an image sensor comprising: a pixel array including a plurality of pixel elements partitioned into rows and columns, each of the pixel elements comprising a light sensor, pixel elements in each row belonging to one of a plurality of different sets, the pixel elements in each row belonging to each set having common couplings for receiving control signals for pixel elements of that set for that row, pixel elements in each column of pixel elements having common couplings for providing a column output signal for that column, contributions of the pixel elements to the column output signal being dependent on the control signals and light energy accumulated by the pixel elements; and an array of digitizers coupled in one-to-one correspondence with columns of the pixel array, the digitizers coupled so as to receive the column output signals from their corresponding column of the pixel array; obtaining a measurement of image intensity signals on the pixel elements by: applying row input signal vectors to the control lines of the pixel array, a different row input signal vector being applied for each set, each row input signal vector being of one of a subset of a set of all possible row input signal vectors that is substantially uncorrelated with all previously applied row input signal vectors for a current frame time, reading outputs of the array of digitizers, and repeating, for a plurality of times, application of the row input signal vectors and reading outputs of the array of digitizers.

In accord with some such aspects the row input signal vectors are based on vectors of a plurality of sampling functions. In accord with some such aspects each sampling function comprises a product of a random basis function and a filtering function having a frequency response tuned to desired spatial frequencies of interest in an expected image signal.

In another aspect the invention provides an image sensor comprising: a pixel array including a plurality of pixel elements partitioned into rows and columns, each of the pixel elements comprising a light sensor; pixel elements in each row belonging to one of a plurality of different sets, the pixel elements in each row belonging to each set having common couplings for receiving control signals for pixel elements of that set for that row; pixel elements in each column of pixel elements having common couplings for providing each of a first column output signal and a second column output signal for that column, contributions of the pixel elements to the column output signals being dependent on the control signals and light energy accumulated by the pixel elements; and an array of digitizers coupled in one-to-one correspondence with columns of the pixel array, the digitizers coupled so as to receive an indication of the column output signals from their corresponding column of the pixel array.

In accord with some such aspects a first storage element is about one side of the pixel array for storing information for use in generating some of the control signals and a second storage element is about another side of the pixel array for storing information for use in generating others of the control signals. In accord with some such aspects the first storage element and the second storage element each comprise an array of storage cells, each storage cell including storage for at least two bits of information. In accord with some such aspects the common couplings for receiving control signals of each pixel element includes a first coupling for receiving a signal indicative of a first of the two bits and a second coupling for receiving a signal indicative of a second of the two bits. In accord with some such aspects digitizer is coupled to columns of the pixel array by a current conveyor and a current limiter.

The foregoing image sensor provides for measurement coefficients determined by a logical comparison of image signal levels, and, therefore, relates, primarily, to the capture of digital image information that may be derived from information of the relative image signal magnitude, e.g., the image coordinates associated with one or more local signal maximums. In other aspects, a machine vision system provides for the capture of information related to the absolute image signal magnitude, i.e., digital pixel values that are uniformly proportional to the light energy impinging on a corresponding portion of an image sensor of the machine vision system.

As such, in another aspect, the disclosed technologies provide a method useful in determining absolute image signal magnitude, the method including forming a pixel output signal based on incoming light energy for each of a plurality of light sensitive pixel elements arranged in ($N_1$–$N_d$) rows and $N_2$ columns in a pixel array, where each of the plurality of light sensitive pixel elements includes a light sensor, and the pixel output signals represent an image signal indicative of an image of a scene; forming a reference output signal on $N_d$ additional rows of dark pixels, each of the additional rows having $N_2$ dark pixels; obtaining a measurement signal of the image signal by a) supplying M sets of $N_1$ control signals to the ($N_1$–$N_d$) rows of the pixel array and the $N_d$ additional rows of the dark pixels, where $N_2$ light sensitive pixel elements of each row and $N_2$ dark pixels of each additional row share common control signals, each of the sets of control signals is representative of a different row of a sampling matrix, the $N_1$ control signals in each of the M sets being in one-to-one correspondence to the total $N_1$ rows, ($N_1$–$N_d$) of which include light sensitive pixel elements and $N_d$ of which include dark pixels, and b) for each of the M sets of control signals, summing pixel output signals to obtain current output for each of the $N_2$ columns; computing a scale factor for each of the $N_2$ columns based on the sampling matrix and a prior known contribution to the current output of the reference output signal formed on the dark pixels; and determining output pixel values from the measurement signal using the scale factors computed for the $N_2$ columns, the output pixel values comprising information of the image signal.

In another aspect, the disclosed technologies provide a machine vision system useful in determining absolute image signal magnitude, the machine vision system including a) an image sensor configured to capture an image signal and process the image signal to output a binary measurement signal, the image signal indicative of light energy collected from a scene. Here, the image sensor includes i) a pixel array of light sensitive pixels and dark sensitive pixels arranged by $N_1$ rows and $N_2$ columns. The pixel array includes A) an array of $N_1$ pixel output control busses in one-to-one correspondence with the $N_1$ rows of the pixel array, each of the pixel output control busses configured and arranged to provide a pixel output control signal to pixels on a respective row of the pixel array, and B) an array of $N_2$ pixel column circuits in one-to-one correspondence with the $N_2$ columns of the pixel array. Each pixel column circuit includes I) a pixel output bus configured and arranged to sum pixel output signals, and II) a linear array of $N_1$ pixels, coupled in one-to-one correspondence with the array of $N_1$ pixel control busses. The linear array of $N_1$ pixels includes (a) a linear array of ($N_1$–$N_d$) light sensitive pixels to receive a portion of the image signal. Each light sensitive pixel includes (i) a light signal source that is responsive to light energy received by the light sensitive pixel, and (ii) an output select circuit, coupled with a pixel output control bus, to control coupling of the light signal source to the pixel output bus through which the light sensitive pixel provides a pixel output signal to the pixel output bus. Additionally, the linear array of $N_1$ pixels includes (b) a linear array of $N_d$ dark pixels. Each dark pixel includes (i) a dark signal source that is responsive to a reference signal received by the dark pixel, and (ii) an output select circuit, coupled with another pixel output control bus, to control coupling of the dark signal source to the pixel output bus through which the dark pixel provides a pixel output signal to the pixel output bus. Further, the image sensor includes ii) a sampling pattern generator coupled with the pixel array, and configured with A) information of a sampling pattern matrix (with M rows and $N_1$ columns), each row of the sampling pattern matrix including information relating to the pixel output control signals, and predetermined to form, through selective summing of the pixel output signals on the array of $N_2$ output busses, an array of $N_2$ measurement coefficients in correspondence with the $N_2$ columns of the pixel array, a measurement coefficient including information of the image signal represented in a non-canonical basis; B) instructions for sequentially providing, to the array of $N_1$ pixel output control busses, each of the M rows of the sampling pattern matrix, so as to form on the $N_2$ pixel output busses, a measurement signal, including an array of $N_2$ measurement coefficients for each of the M rows of the sampling pattern matrix; and C) instructions for providing, to the dark pixels of the pixel array, a reference signal for controlling a contribution of dark pixels to the measurement signal. Furthermore, the image sensor includes iii) a digitizer, coupled with the array of $N_2$ pixel output busses, for binarizing the measurement signal to form a binary measurement signal. Additionally, the machine vision system includes a digital processor, coupled with the image sensor to receive the binary measurement signal. Here, the digital processor is configured with i) information regarding the sampling pattern matrix and the contribution of dark pixels to the measurement signal; ii) instructions for accessing, from the binary measurement signal, a column binary measurement vector corresponding to a column of the pixel array; and iii) instructions for forming a digital pixel value, the digital pixel value including information of the image signal as received, by A) finding a column signal vector that has a binary measurement space representation that is substantially correlated with the column measurement vector, and B) processing the column signal vector together with the contribution of dark pixels to the measurement signal, to form the digital pixel value.

These and other implementations can include one or more of the following features. In some implementations, the instructions for finding a column signal vector can include instructions to multiply the transpose of the sampling pattern matrix by the column measurement vector.

In some implementations, the instructions for processing a column signal vector can include a) instructions that use one or more coefficients of the column signal vector corresponding to dark pixels for determining a scale factor, and b) instructions to multiply a coefficient of a signal vector corresponding to light sensitive pixels by the scale factor to form the digital pixel value. For instance, the scale factor can be determined as a ratio of (1) a statistic of levels of the reference signal received by the dark pixels, and (2) a statistic of values of coefficients of the column signal vector that correspond to the rows of the pixel array that have dark pixels.

In some implementations, the reference signal received by the dark pixels can be an electrical signal. Moreover, a value of the reference signal received by all dark pixels can be substantially the same. In some implementations, the sampling pattern generator can include a reference signal source configured to provide the reference signal to the dark pixels, and a pixel output controller configured to provide a sequence of the pixel output control signals to the array of pixel output control busses.

In some implementations, for each row of the M rows of the sampling matrix, the digitizer can form an array of $N_2$ binary measurement coefficients of the binary measurement signal, the $N_2$ binary measurement coefficients having respective $N_2$ one-bit values {+1 or −1} that are representative of signs of respective $N_2$ measurement coefficients formed on the array of $N_2$ output busses for the row of the sampling matrix.

In some implementations, each of the pixel output control buses can include two or more conductors for selectively coupling two or more pixel signal sources of a pixel column circuit to one of two or more conductors included in a pixel output bus of the pixel column circuit to form a differential signal on the pixel output bus. Here, the digitizer can include an array of $N_2$ comparators coupled in one-to-one correspondence to the respective pixel output busses of the array of $N_2$ pixel column circuits.

These and other aspects of the invention are more fully comprehended upon review of this disclosure.

DETAILED DESCRIPTION

Figure 1A:
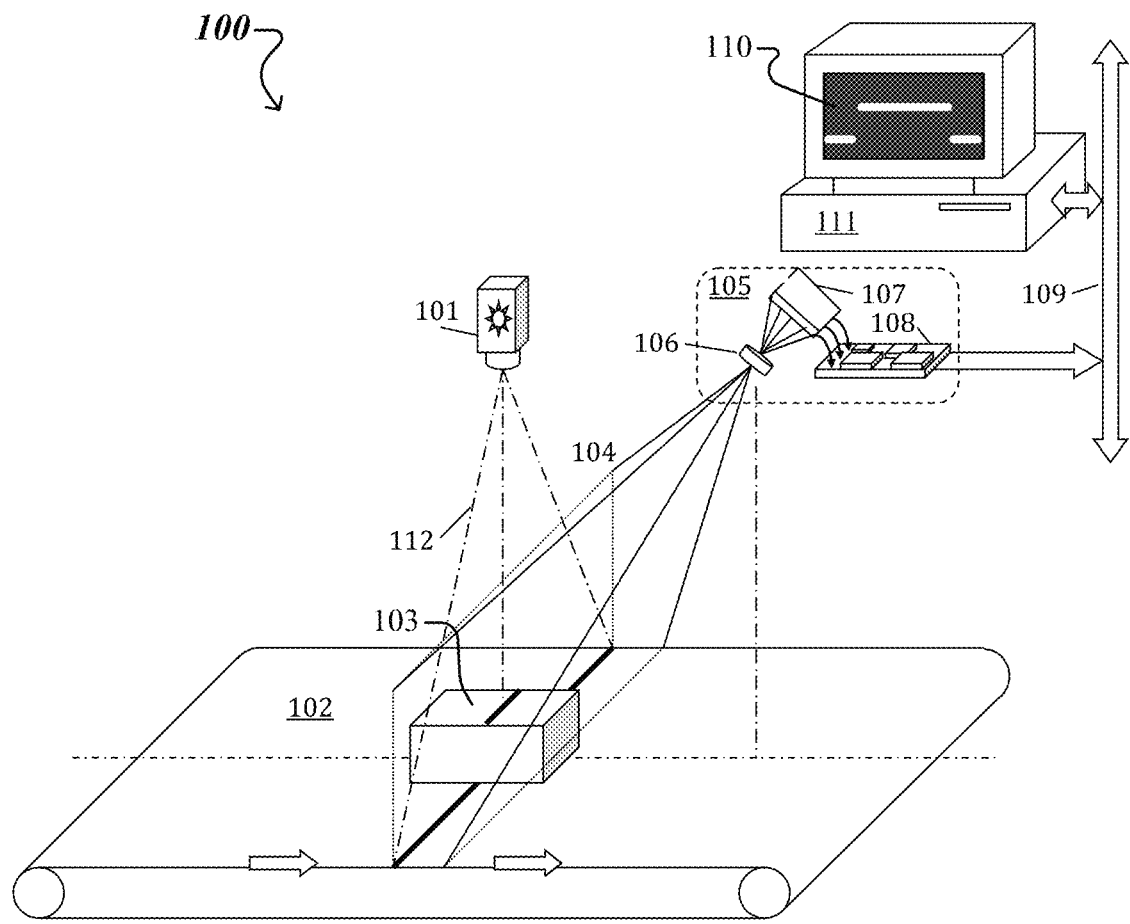
FIG. 1A is a semi-block diagram, semi-illustration of aspects of a machine vision system in an operational environment.

FIG. 1A is a diagram of a vision system 100 for implementing a known method for capturing 3D range images. FIG. 1A comprises, laser-line generator 101, object conveyor 102, object of interest 103, laser illuminated object plane 104, digital camera 105, digital communication channel 109, and digital computer 111 for storing, processing, interpreting and displaying 3D range data extracted from object of interest, which are graphically represented in FIG. 1A by result 110. Digital camera 105 further comprises, imaging lens 106, image sensor 107, and local image processor 108.

In operation a narrow plane of illumination 112, formed by laser-line generator 101 intersects a 3D scene including conveyor 102 and object-of-interest 103. The narrow plane of illumination formed by laser-line generator 101 is coincident with object plane 104 of imaging lens 106. Imaging lens 106 collects light scattered by the 3D scene and focuses it on image sensor 107. Image sensor 107, which comprises a rectangular array of photosensitive pixels, captures an electrical signal representative of the average light intensity signal formed by lens 106 over an exposure time period. The electrical signal formed on image sensor 107 is converted into a digital information stream, which is received by local digital processor 108. Digital processor 108 formats the digital image information for transmission to digital computer 111. In some implementations local digital processor 108 also processes the image to form an alternative representation of the image or extract relevant features to arrive at a critical measurement or some other form of compact classification based on the information of the digital image.

Generally, the image captured by digital camera 105 is processed, either by local digital processor 108 or digital computer 111, to measure the displacement of the line formed by the intersection of the illumination-plane with object in the scene. Each displacement measurement represents an image coordinate that may be transformed into an object surface coordinate in object plane 104, according to a predetermined camera calibration. In some applications object 103 is moved through the plane of the laser-line generator 101 while successively capturing images and extracting displacements coordinates at regular intervals. In this way a map of the surface of object 103 that is visible to the vision system 100 of FIG. 1A can, over time, be constructed by digital computer 111.

Figure 1B:
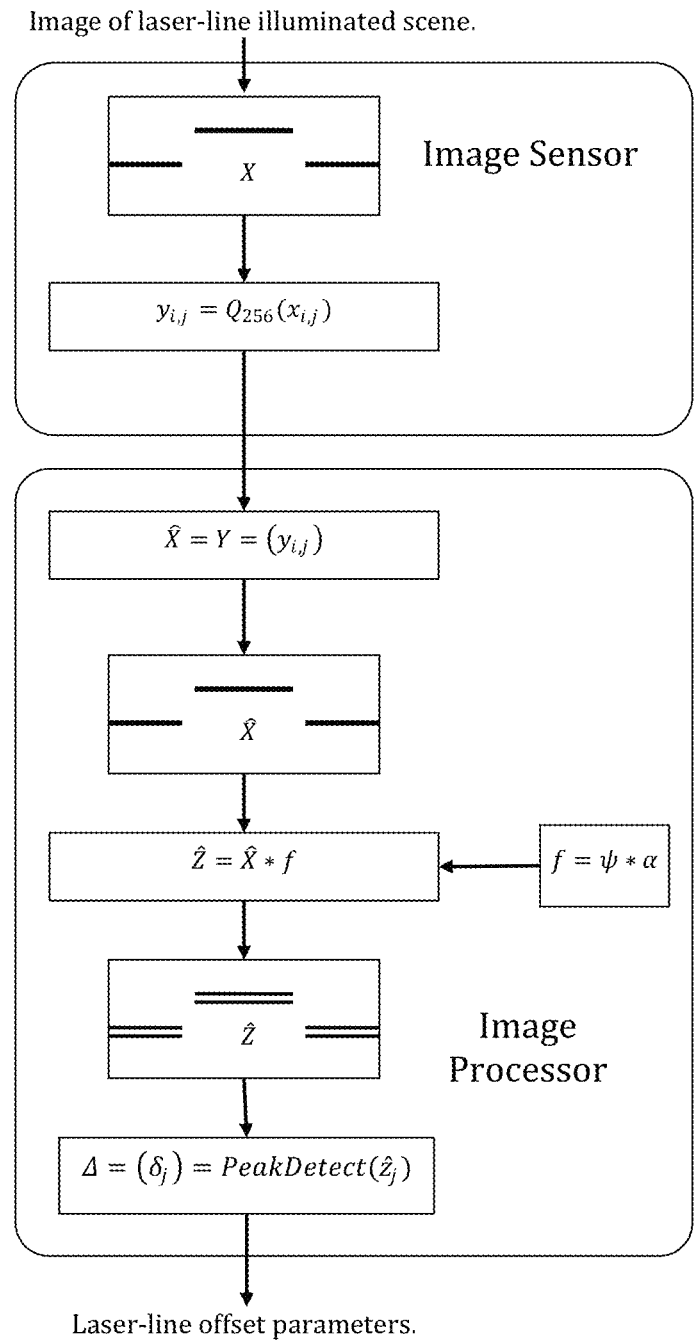
FIG. 1B is a diagram of the computations of a vision system of the prior art.

In order to facilitate a better understanding of aspects of the present invention, as it relates to conventional vision systems of the known art, an example generally based on the prior art is discussed with respect to FIG. 1B. However the discussion is cast in terms consistent with subsequent disclosure with respect to the present invention.

In the following descriptions uppercase symbols, generally, represent matrix quantities, row numbers of a matrix are identified by the subscript i, column numbers by the subscript j, and frame time by the subscript t. Lowercase symbols represent scalar or vector values, for example, $x_{i,j}$ refers to one element of X and $x_j$ refers to a column vector of X. Parentheses are used to collectively reference all of the vectors or elements of a matrix, for example $X=(x_j)=(x_{i,j})$.

In the computations outlined by FIG. 1B:

The symbol X, $X \in \mathbb{R}^{N_1 \times N_2}$, represents an image intensity signal, as it exists on the $N_1$ pixel rows and $N_2$ pixel columns of the pixel array.

The symbol Y, $Y \in \{0, 1, 2 \ldots 255\}^{N_1 \times N_2}$, represents the product of the image signal X and the canonical sampling function quantized by $Q_{256}(.)$ to 256 levels.

The symbol $\hat{X}$, $\hat{X} \in \{0, 1, 2 \ldots 255\}^{N_1 \times N_2}$ represents the image intensity signals recovered from a measurement Y.

The symbol f represents a convolution kernel, which may be a band-pass filter, created by the linear combination of smoothing coefficients $\alpha$ and edge detection coefficients $\psi$.

The symbol $\hat{Z}$, $\hat{Z} \in \{-256 \ldots 255\}^{N_1 \times N_2}$, represents the recovered image signal $\hat{X}$ convolved by f, which may result in $\hat{Z}$ being, for example, the approximate partial derivative of the recovered image signal $\hat{X}$ with respect to rows.

The symbol $\Delta$, $\Delta \in \{0, 1, 2 \ldots N_1\}^{P \times N_2}$ represents image offset parameters of the local signal extremes, i.e. the P relevant signal peaks of the signal $\hat{Z}$ on each column.

In FIG. 1B, the process receives information representative of light energy of a scene. The information may be considered image intensity signals, for example X, where $X \in \mathbb{R}^{N_1 \times N_2}$ and represents the image intensity signals as it exists on the $N_1$ pixel rows and $N_2$ pixel columns of the pixel array. The information may be received by an image sensor, for example image sensor 107 of FIG. 1A.

The image signal X of FIG. 1B includes three segments of a laser line, with a third segment being horizontally between and vertically offset from a first segment and a second segment, representative of, for example, the image of the intersection of illumination plane 112 with conveyor 102 and object 103 of FIG. 1A. The image signal X may also include unwanted off-plane illumination artifacts and noise (not shown). The illumination artifacts may be light internally diffused from one portion of an object to another, for example, light of the laser line, and the noise may be introduced by ambient light or by the image sensor.

In general, the function of the computations outlined in FIG. 1B is to extract row offset parameters associated with the image features of the curve formed of the intersection of a plane of illumination with objects of interest in a physical scene. The conventional method includes steps of sampling the image signal, forming a digital image, filtering the digital image, and extracting image features from the filtered digital image.

A major limitation associated with the conventional machine vision process outlined in FIG. 1B is that a 2-dimensional intensity image of substantial size must be captured by the digital camera for each and every line of physical coordinates formed by the system. This can make the time to capture the 3D image of a scene as much as 100 times longer than the time required to acquire an intensity image of the same size scene, thereby rendering laser-line based 3D image formation methods too slow for many industrial machine-vision applications.

The time it takes to generate a conventional digital representation of an image signal captured by an image sensor, is a function of the size of the image, the speed of the digitizer and the number of digitizers. Conventional image sensors operate by sampling voltage signals generated by each pixel of the array; quantizing the voltage into hundreds, or even thousands, of levels to form a digital intensity image. The process of digital readout includes switching the voltage signal of a pixel on to a conductor connected to the sampling device, waiting for the signal to develop and stabilize, sampling the voltage signal, comparing the sampled voltage signal in multiple discrete steps to a reference signal(s) to arrive at a digital value. Known methods of improving the image capture rate involve restricting the number of rows (or columns) to the minimum number required to accommodate the expected laser-line displacement by objects in the scene, but in practice useful displacement images still require hundreds of rows of pixel readout. Other methods of improving the image capture rate involve the use of multiple analog-to-digital converters. In practice however, the number of analog-to-digital converters is restricted by the conductors necessary to access the individual pixel voltages. In a conventional CMOS image sensor conductors are non-transparent, typically positioned in the optical path near photosensitive areas, and can only be stacked in a finite number of layers. The forgoing typically limits the useful number of digitizers to be less than or equal to the number of columns or rows of the pixel array. Much is known about high-speed methods for digitizing images, but, ultimately, there are certain practical limits to the speed that can be achieved using conventional methods of digital image acquisition.

In the present machine vision application, we observed that a scene illuminated by a plane of light will be viewed by a camera as a relatively sparse image, i.e. an image in which the vast majority of image sensor pixels can be represented by the numeric value zero, having receive very little (or no) light from the scene. We further observe that, the intersection of the visible illumination plane with practical objects-of-interest moving through the camera field of view are, generally, piecewise smooth and continuous functions, and the image information content that we seek could be adequately represented by just a few bits per column of the image. Given the intended application, it is readily apparent that the useful information content of the image signal stream is exceedingly small relative to the dimension of the signal, implying that conventional image digitization methods spend most of their time sampling and converting redundant signal information. Significant improvement in the throughput of the vision system might be possible if such redundant readout and conversion of the analog image signal could be avoided.

In the field of compressive sensing it has been shown that, under certain conditions, a signal vector $x \in \mathbb{R}^N$ consisting of zeros and K non-zero coefficients can be recovered from only $$M = O\left(K \log\left(\frac{N}{K}\right)\right)$$

measurements. In this formulation:

$y=Ax, y \in \mathbb{R}^M$, where $A \in \mathbb{R}^{M \times N}, M << N$.

The conditions alluded to above are that any relevant variation of signal vector x must result in the formation of a unique measurement vector y, such that:

$Ax_1 - Ax_2 \neq 0$ for all $x_1 \neq x_2$

Given the above, x can be recovered from y and A by searching for the maximally sparse vector $\hat{x}$ that generates a matching measurement vector y.

$\hat{x} = \arg \min \|x\|_0$ subject to $y = Ax$

The computational complexity of such a search grows exponentially with the dimensionality of the search space, which is directly proportional to K, the sparseness of the signal vector x. This fact makes the solution generally intractable for larger values of K, that is, unless 1) x is sufficiently sparse and 2) the measurement matrix A conforms to the, so called, restricted isometry property, which requires the existence of a constant δ such that for signal vectors x of sparseness K.

$$(1-\delta)\|x\|_2^2 \leq \|Ax\|_2^2 \leq (1+\delta)\|x\|_2^2$$

The preceding implies that for small constants δ the measurement and the signal have sufficiently similar $l_2$ norms, in which case convex optimization methods apply whereby $\hat{x}$ can be found at its $l_1$ minimum, subject to the constraint that it is consistent with the measurement $$\hat{x} = \arg\min\|x\|_1 \text{ subject to } y = Ax$$

Assuming additive noise vector n, where $\|n\|_2 \leq \epsilon$ $$\hat{x} = \arg\min\|x\|_1 \text{ subject to } \|y - Ax\| \leq \epsilon$$

Regardless of the recovery method, the essential element of the compressive sensing model is a prior knowledge of signal sparseness, without which it is difficult or impossible to guarantee a unique mapping from the signal vector x to the measurement vector y or to provide for efficient recovery, even if a unique mapping does exist.

In light of the sparseness of the anticipated image signal, the forgoing model of compressive sensing seems promising. However, there are, ostensibly, significant difficulties relative to known methods of image sensor design and fabrication. One difficulty is that both the measurement vector y and the sampling function A are assumed to consist of coefficients belonging to the set of real numbers. To achieve a speed improvement over conventional methods would require a huge number of high dynamic-range analog computations performed in parallel, plus the precision digitization of the resultant analog signal.

Some of the difficulties associated with the practical implementation mentioned above are addressed by the theories of 1-bit compressive sensing, which is, essentially, conventional compressive sensing theory with extreme quantization of the measurement signal y. In 1-bit compressive sensing each measurement is quantized to 1-bit by the function sign(.), and only the signs of the measurements are stored in the measurement vector y.

$$y = \text{sign}(Ax), \text{ where } y \in \{1, -1\}^M$$

The preceding represents a simplification of the analog-to-digital conversion process, which provides some hope for realistic implementation. Note, however, that the nature of the measurement process is to destroy the scale information from the original signal. Therefore, in this formulation only partial reconstruction, within a scale factor, is possible. This fact has significance relative to the design of the image sensor of the present invention that will be explained later.

To estimate the actual potential of 1-bit compressive sensing relative to acceleration of the digital capture of information contained within the image of a scene illuminated by a plane of light, it is necessary to appreciate the nature of the relationship that exists between the signal vector x, the sampling matrix A, and the measurement vector y.

Let $x_1$ and $x_2$ represent any of two signal vectors $x_1 \neq x_2$ normalized to the unit sphere, and let measurement $y_1 = \text{sign}(Ax_1)$ and measurement $y_2 = \text{sign}(Ax_2)$, then, sign(Ax), which maps $\mathbb{R}^N \to \mathcal{B}^M$, is a, so called, binary ε-stable embedding of order K for a K-sparse signal x if $$d_{ang}(x_1, x_2) - \epsilon \leq d_{ham}(y_1, y_2) \leq d_{ang}(x_1, x_2) + \epsilon$$

In words, the normalized vector angle between any two signals is equal to the normalized Hamming distance between their measurements, within some tolerance ε.

In 1-bit compressive sensing it has been shown that if A consists of I.I.D (Independent and Identically Distributed) random variables, e.g. a Bernoulli distribution, and ε>0, then y=sign(Ax) is a binary ε-stable embedding with probability $P_r > 1 - \rho$ for $$M \geq \frac{2}{\epsilon^2}\left(K\log(N) + 2K\log\left(\frac{50}{\epsilon}\right) + \log\left(\frac{2}{\rho}\right)\right)$$

The preceding equation predicts the lower bound on the number of samples required to ensure the recognition of a signal of a certain size and sparseness to a designated resolution.

To arrive at an estimate of the minimum number of samples M required to encode a column of an image formed of a scene illuminated by a plane of light, we begin by assuming that the signal x can be modeled as a sparse image vector comprising a narrow laser-line pulse shifted to some row offset θ. Such an ideal laser line pulse signal would be K=1 sparse on each column vector of the image.

Assuming that one wishes to estimate θ within some shift tolerance δ=1, implies that ε<0.50 is necessary to guarantee a minimum level of accuracy.

Therefore, to ensure $$d_{ang}(x_\theta, x_{\theta+\delta}) - \epsilon \leq d_{ham}(y_\theta, y_{\theta+\delta}) \leq d_{ang}(x_\theta, x_{\theta+\delta}) + \epsilon$$

to probability greater than 0.90, given K=1, N=512, ε<0.50 theoretically requires only:

$$M \geq \frac{2}{0.50^2}\left(1\log(512) + 2\log\left(\frac{50}{0.50}\right) + \log\left(\frac{2}{0.10}\right)\right) =$$

148 Bits/Image Column.

The preceding calculation implies the potential for substantial data reduction relative to the 8-bit/pixel digital image, typically formed by conventional CMOS image sensors. To the extent that the throughput, i.e. frame rate, of the image sensor, is governed by the amount of information processed, it is not unreasonable to anticipate speed improvements of the same order of magnitude.

Unfortunately, some of the assumptions associated with the ideal example case described above depart significantly from practical reality. For example, the column vectors of an image formed of a plane-of-light illuminating the surface of an object, although generally containing less nonzero elements than a normally illuminated image, still contain many more nonzero values than necessary to encode the position of the laser line to the nearest pixel. This is due to the fact that, even in the best case, the image of the laser line has a finite and variable thickness in terms of the number of rows it occupies on any given column of the image. Additionally, it is common for some of the light scattered or diffused by the object to illuminate other points of the surface of the object that are not in the plane of the laser, but nonetheless are in the field-of-view of the camera, and thereby contribute to the sum of nonzero values in the image. Since the typical laser-line image is already relatively sparse, a linear transformation into a different basis typically does not provide a meaningful reduction in nonzero signal coefficients. Noise and certain unavoidable nuisance parameters associated with the laser-line image contribute directly to the number of nonzero values in the image signal and indirectly to the number of samples M that are necessary to capture a measurement that accurately encodes the laser line coordinates in the measurement. Moreover, depending on the implementation of the digital processor, the task of restoring the digital signal from the measurement can quickly grow to dominate the effective cycle time, rendering compressive sensing methods useless for the purpose of improving vision system throughput.

An aspect of the present invention is that, unlike the system of FIG. 1B, the original image signal X is not encoded in the measurement Y, because doing so would, necessarily, require the encoding of additional image information that is not directly relevant to extracting the offset parameters of the intersection of the illumination plane with objects of interest in the physical scene. Rather, a filtered image signal Z is encoded in the measurement Y. One reason for this is that, as explained above, the number of samples required to embed all variation of the signal to a specific error tolerance $\epsilon$ is of order $O(K \log(N))$. By filtering the image signal X to attenuate spatial frequencies that do not contain information essential to the extraction of the laser-line offset parameters, the sparseness of Z increases, such that $K_Z < K_X$ and the number of samples required to robustly encode the filtered signal in the measurement Y will, in practice, always be less (often much less) than, the number of samples required to encode the raw image signal X, assuming that the error tolerance E remains the same.

Figure 2A:
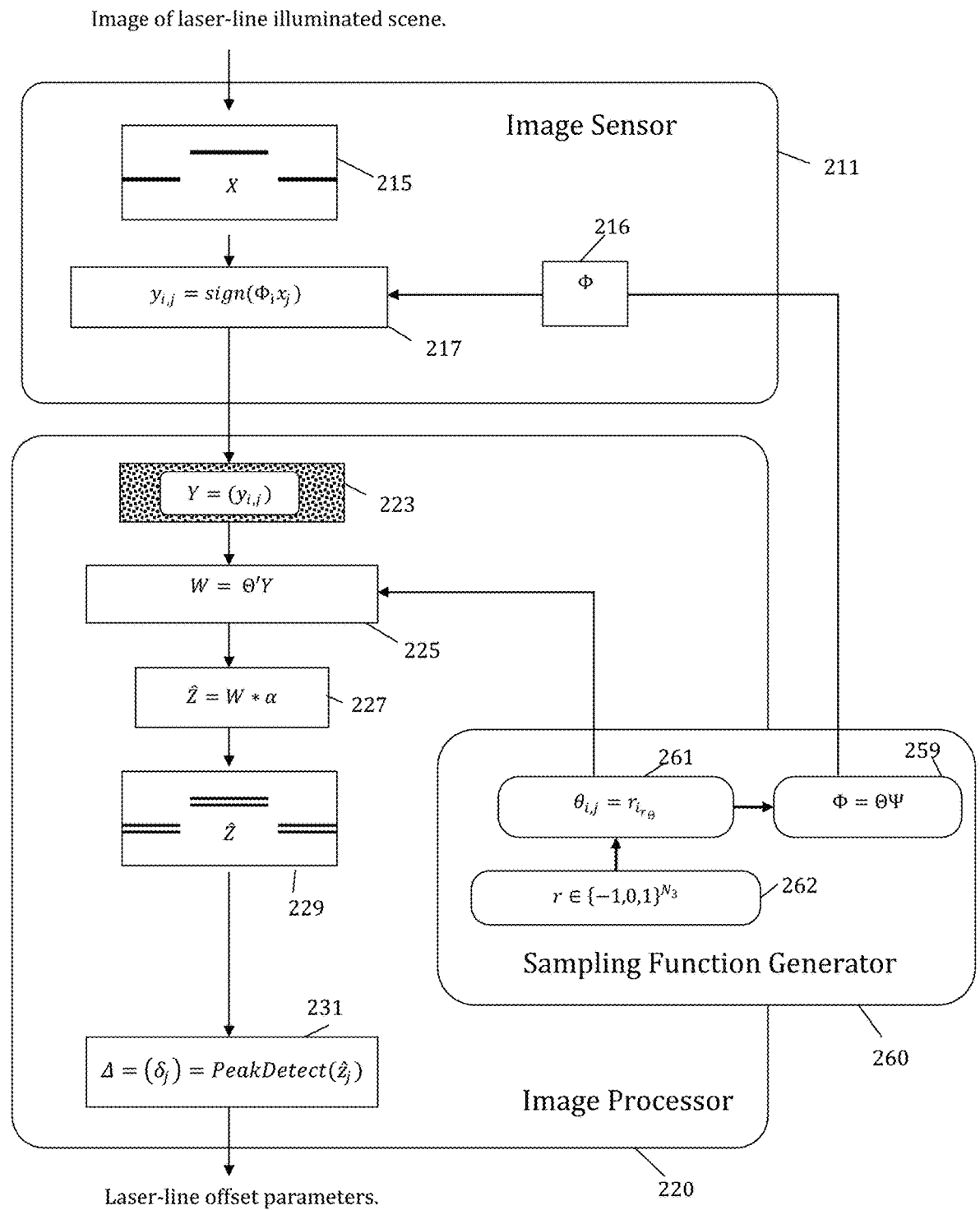
FIG. 2A is a flow diagram of a process depicting computations performed by a machine vision system in accordance with certain aspects of the present invention.

FIG. 2A depicts a semi-flow diagram of a process, particularly computations of the process, performed by a machine vision system in accordance with aspects of the invention. The machine vision system may be, for example, a system including some or all of the hardware of the system 100 of FIG. 1A.

In the computations outlined in FIG. 2A:

The symbol X, $X \in \mathbb{R}^{N_1 \times N_2}$ represents an image intensity signal as it exists on $N_1 \times N_2$ pixel elements of an image sensor, with for example pixel elements of the image sensor forming a pixel array which may have $N_1$ pixel rows and $N_2$ pixel columns.

The symbol $\Psi$, $\Psi \in \{-1, 0, 1\}^{N_1 \times N_1}$, represents an image filtering function comprised of, and in some embodiments consisting of coefficients used to compute a central difference approximation of the partial first derivative with respect to rows of the image signal X.

The symbol $r \in \{-1, 0, 1\}^{N_3}$, represents a sparse random sequence, which in some embodiments is based on a Markov chain of order m, where m>1.

The symbol $\Theta$, $\Theta \in \{-1, 0, 1\}^{M \times N_1}$, represents a random basis function, created by drawing row vectors from r.

The symbol $\Phi$, $\Phi \in \{-1, 0, 1\}^{M \times N_1}$, represents an image sampling function, formed from the product of the random basis $\Theta$ and the filtering function $\Psi$.

The symbol Y, $Y \in \{-1, 1\}^{M \times N_2}$, represents a measurement of the filtered image intensity signal, formed from the product of the sampling function $\Phi$ and the image signal X, quantized by sign(.) to two levels $\{-1, 1\}$.

The symbol W, $W \in \{-M \ldots M\}^{N_1 \times N_2}$, represents an estimate of the filtered image signal, formed from the product of the measurement Y and the transpose of the random basis function $\Theta$.

The symbol $\hat{Z}$, $\hat{Z} \in \{-M \ldots M\}^{N_1 \times N_2}$, represents an estimate of the product of the original image signal X and the filtering function $\Psi$.

The symbol $\Delta$, $\Delta \in \{0, 1, 2 \ldots N_1\}^{P \times N_2}$ represents image offset parameters of the local signal extremes, i.e. the P relevant signal peaks of the signal Z on each column.

In FIG. 2A, block 215 represents information of the image signal X, which is information representative of light energy of a scene. The information may be received by an image sensor, for example image sensor 107 of FIG. 1A. The light energy may be light scattered from the scene, with at least some of the light focused by a lens onto the image sensor. The image may also include unwanted off-plane illumination artifacts and noise (not shown). The illumination artifacts may be light internally diffused from one portion of an object to another, for example light of the laser line, and the noise may be introduced by ambient light or by the image sensor, for example.

Block 217 includes a representation of a process that generates a measurement Y of the image intensity signal X. The measurement Y represents a product of the image signal X and the sampling function $\Phi$, quantized to two levels. In most embodiments the sampling function is a product of a random basis function and a spatial filtering function. In some embodiments the random basis function is sparse, the non-zero elements drawn from a Bernoulli distribution or some other generally random distribution. In some embodiments the sampling function is expected to generally pass spatial frequencies associated with portions of an image forming a laser line and to substantially reject spatial frequencies associated with portions of an image including noise and other unwanted image information. In some embodiments the process of block 217 extracts information of the image signal X by iteratively generating elements of a measurement Y. Generation of the information of the measurement Y may be performed, in some embodiments, by an image sensor device and/or an image sensor device in conjunction with associated circuitry.

In some embodiments elements of Y are generated in M iterations, with for example each of the M iterations generating elements of a different $y_i$. In some embodiments, for example embodiments with an image sensor having pixel elements arranged in $N_1$ rows and $N_2$ columns and a sampling function having M rows and $N_1$ columns, in each iteration information of a different particular row of the sampling function is effectively applied to columns of the image sensor to obtain, after performing sign operations on a per column basis, a $y_i$. In some embodiments elements of a $y_i$ are obtained substantially simultaneously. In some embodiments comparators are used to perform the sign operations.

In some embodiments, for each iteration information of each row $\phi_i$ of the sampling function is used to generate control signals applied to pixel elements of the image sensor, with each row of pixel elements receiving the same control signal or signals. Accordingly, in some embodiments, for a first iteration control signal(s) based on information of $\phi_{1,1}$ may be applied to pixel elements of a first row of pixel elements, control signal(s) based on information of $\phi_{1,2}$ may be applied to pixel elements of a second row, and so on. Similarly, for an Mth iteration, control signal(s) based on information of $\phi_{M,1}$ may be applied to pixel elements of the first row, control signal(s) based on information of $\phi_{M,2}$ may be applied to pixel elements of the second row, and so on.

In some embodiments, and as shown in FIG. 2A, the image signal sampling information is provided from the sampling function generator block 260. As illustrated in FIG. 2A, the sampling function generator block is associated with an image processor 220, which in various embodiments may be, variously, the local digital processor 108 or digital computer 112 of FIG. 1A. It should be recognized, however, that in various embodiments the sampling function generator, or portions thereof, may be included in the image sensor 211. In some embodiments, the image sensor, or memory or circuitry associated with the image sensor, provides storage for storing the image signal sampling information, for example as illustrated by block 216 of FIG. 2A. In some embodiments neither the image sensor nor the image processor include a sampling function generator block, with instead pre-generated image signal sampling information stored in storage of or associated with the image sensor. In some embodiments the image signal sampling information may be stored in both of two storage elements, with a first storage element physically closer to some pixel elements and a second storage element physically closer to other pixel elements. For example, if columns of pixel elements forming the pixel array are considered to be arranged in a manner defining a square or rectangle, the first storage element may be about what may be considered one side of the pixel array, and the second storage element may be about an opposing side of the pixel array. In some such embodiments pixel elements closer to the first storage element may receive control signals associated with the first storage element, and pixel elements closer to the second storage element may receive control signals associated with the second storage element.

Figure 6:
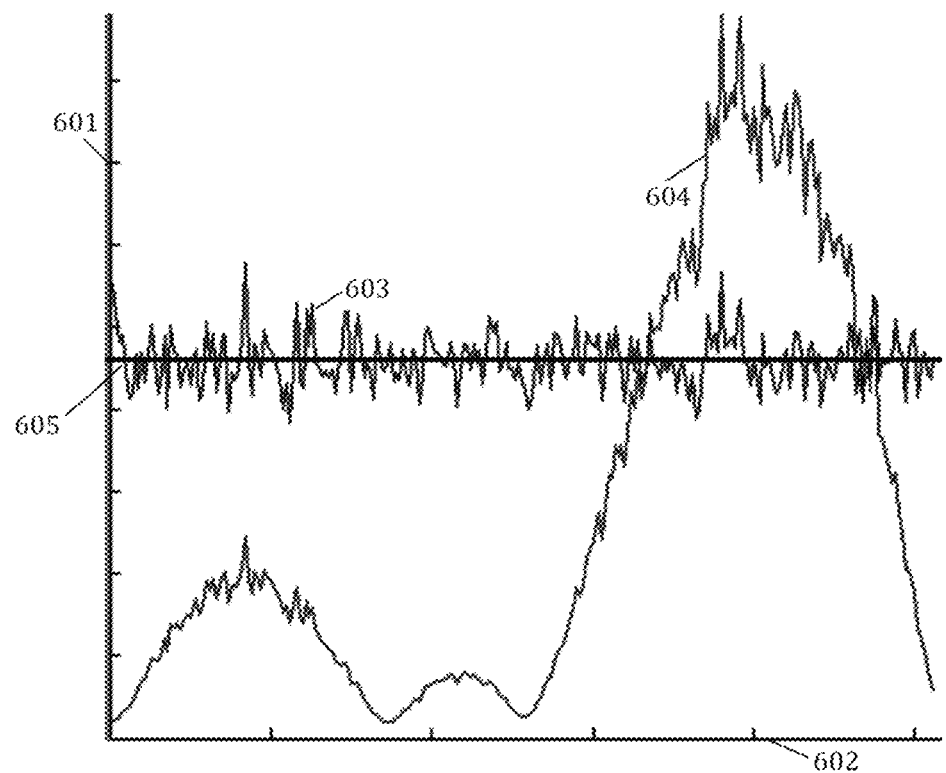
FIG. 6 is a graph illustrating sensor response curves.

FIG. 6 is an exemplary graph illustrating spatial frequency response, taken here with respect to image rows, representative of some embodiments in accordance with aspects of the invention. FIG. 6 includes frequency response axis 601, frequency axis 602, flat frequency response line 605, and frequency response curve 603 of a conventional compressive sampling function, and frequency response curve 604 which is exemplary of some embodiments of the present invention.

Generally, a signal sensing apparatus, for example an image sensor, provides a set of basis vectors capable of sampling a signal to encode, as completely as possible, the information from a signal in a measurement. A canonical sampling function, conforming to a minimum regular sampling rate criterion, (e.g. Nyquist's criterion), represents, in effect, a perfectly flat frequency response curve, as illustrated in frequency response curve 605, and, in theory, any conforming signal can be perfectly reconstructed from its measurement vector.

Compressive sensing methods allows traditional sampling rate criteria to be relaxed based on a priori knowledge regarding the information content of the signal, as represented in terms of sparseness or compressibility, which is the minimum number of coefficients necessary to accurately represent the signal in some, possibly unknown, orthogonal linear basis. In order to provide this generality the compressive sampling function must have an approximately flat frequency response, such as exhibited in frequency response curve 603, which was derived from a conventional compressive sampling function based on random projections. This requirement is self-evident in light of the fact that, in general, knowledge about the amount of information included in a signal conveys no information whatsoever about the frequency distribution. Therefore, the frequency response of the conventional compressive sampling function must be approximately flat to guarantee general sparse signal recoverability.

In contrast to the frequency response curve of the canonical sampling function 605 and conventional compressive sampling function 603, the frequency response depicted in curve 604, which is exemplary of some embodiments of the present invention, is decidedly not flat. This is because, in this example, the sampling function was formed, not only with a priori knowledge of the signal's general information content, but also with a prior knowledge of the spatial frequency distribution, not only of the signal, but of the signal's information content.

Returning to FIG. 2A, and blocks 261,262,259 of the sampling function generator, in some embodiments the vector r, $r \in \{-1, 0, 1\}^{N_3}$, where $N_3 = N_1 + 2Md$ and $d = $ support ($\psi$), the size of the spatial filtering kernel $\psi$. In some embodiments, information of the vector r can be understood as having been formed from the element-wise product of two vectors b, $b \in \{-1, 1\}^{N_3}$ and c, $c \in \{0, 1\}^{N_3}$, as in the following:

$$r = (r_i) = (b_i c_i)$$

where b is based on a random distribution:

$$P(b_i = 1) = P(b_i = -1) = \frac{1}{2}$$

and c is based on a Markov chain of order $m = 2d$:

$$P(c_i = 1 \mid c_{i-r} = 1) = \frac{\sum_{r=1}^{m} F(r)(r-d)}{d},$$

where $$\begin{cases} F(r) = 0, r \le d \\ F(r) = 1, r > d \end{cases}$$

The random basis functions $\Theta$ are derived by sampling the vector r according to the following equation:

$$\theta_{i,j} = r_{i_{r_\Theta}} \text{ where } i_{r_\Theta} = m(i-1) + (j-1)$$

In words, the rows of the random basis functions $\Theta$ are $N_1$ element segments of r that are shifted by no less than m relative to each other.

The sampling functions $\Phi$ can be thought of as being formed from the convolution of the rows of $\Theta$ with a filtering kernel $\psi$ as follows:

$$\phi_i = \theta_i * \psi$$

which in FIG. 2A is stated as:

$$\Phi = \Theta\Psi, \text{ where } \Psi = I * \psi$$

In some embodiments the convolution kernel performs spatial filtering based on a central difference approximation of the first derivative, for example, $\psi = (+1, +1, +1, 0, -1, -1, -1)$, in which case:

$$m \ge 2d = 14$$

In general, m should be of sufficient size to ensure that the range of the sampling function $\Phi$, which is limited by the image sensor hardware to discrete levels, is guaranteed. In the preferred embodiment, the elements of $\Phi$ are all in range, i.e. $\phi_{i,j} \in \{-1, 0, 1\}$ and that the rows of the sampling function $\Phi$ are sufficiently uncorrelated.

In block 223 the process buffers a measurement Y of the image signal. The measurement is comprised of the column vectors $y_j$ of the measurement of the image intensity signals. In most embodiments the measurement of the image signal is formed by circuitry of or associated with the image sensor, and the measurement may be stored in memory of or associated with the image processor. The image sensor and the image processor for the embodiment of FIG. 2B and the other embodiments, may be coupled by a serial data link, in some embodiments, or a parallel data link, in other embodiments. In addition, operations of blocks 225-231, discussed below, may also be performed by circuitry of or associated with the image processor.

In block 225 the process forms W a first estimate of the filtered image Z. In the embodiment of FIG. 2A, the estimate is determined by the product of the transpose of the random basis function Θ and the measurement Y. In block 227 the process refines the estimate of the filtered image Z. In some embodiment, and as shown in FIG. 2A, the estimate of the filtered image formed by the process of block 255 is refined by convolution with a kernel α.

In some applications involving laser-line illumination, the laser-line may sometimes be modeled by a square pulse of finite width where the width of the laser-line pulse is greater than (or equal to) the support of the filtering kernel ψ. In accordance with the model described above the image averaging kernel is sometimes matched to the expected output of the filtering kernel ψ. For example, if the filtering kernel is given by ψ=(+1, +1, +1, 0, −1, −1, −1) then the convolution kernel of block 227 may be α=(1, 2, 3, 3, 2, 1).

It may be noted that the refinement step of block 227 could be performed in block 225 by folding the kernel α into the transpose of the random basis function Θ before computing its product with the measurement Y. However, performing the operation by convolution in block 227 provides for a significant computational advantage in some embodiments where the matrix multiplication of block 225 is performed by methods of sparse matrix multiplication.

Block 229 buffers a final estimate of the filtered image $\hat{Z}$. Locations of edges of laser lines in the estimate are determined by the process in block 231, for example using a peak detection algorithm.

Figure 2B:
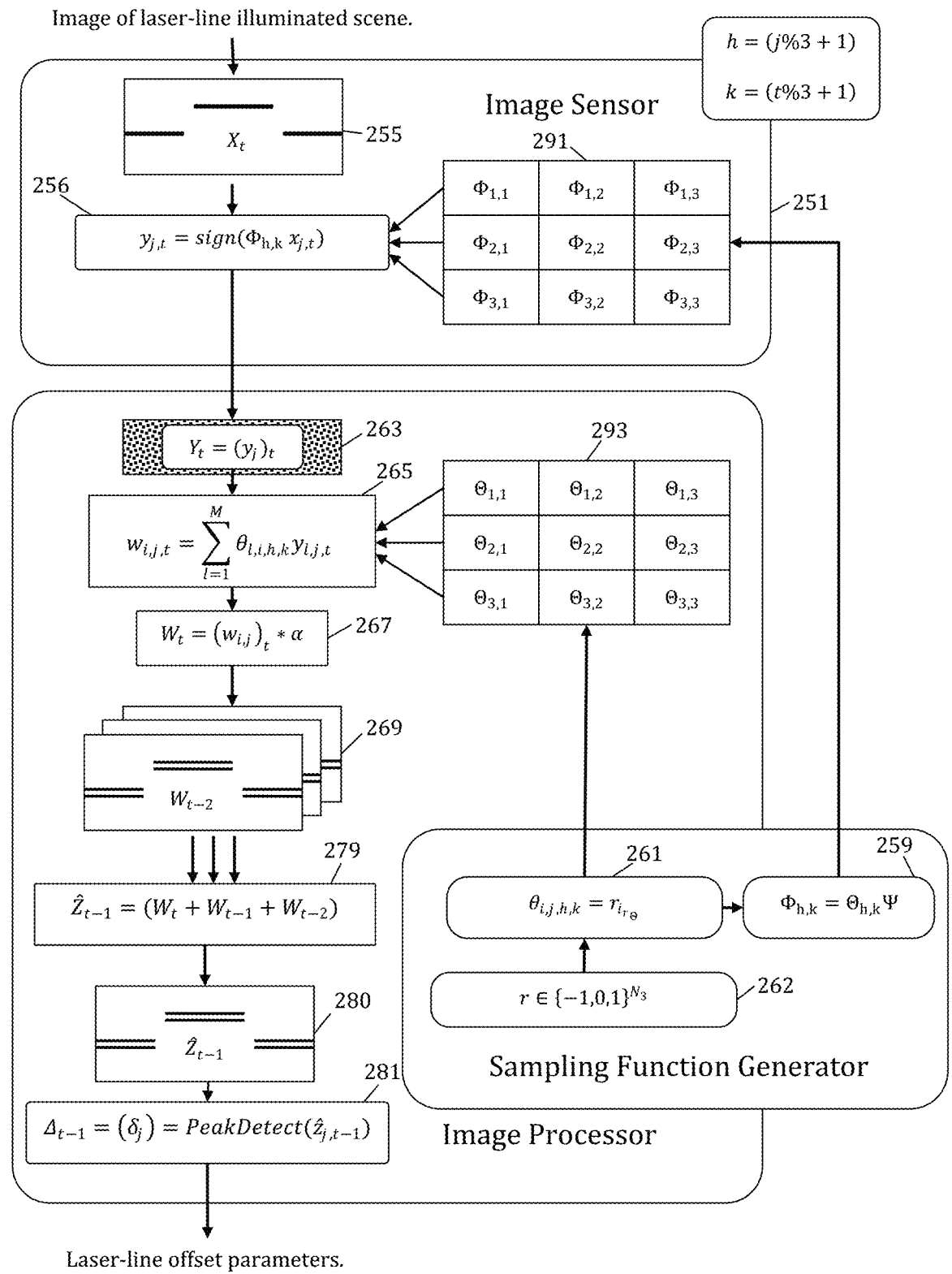
FIG. 2B is a flow diagram of a further process depicting computations performed by machine vision system in accordance with certain aspects of the present invention.

FIG. 2B depicts a semi-flow diagram of a process, particularly computations of the process, performed by a machine vision system in accordance with certain aspects of the present invention. The machine vision system may be, for example, a system including some or all of the hardware of the system 100 of FIG. 1A.

The process of FIG. 2B, takes advantage of the a priori knowledge that the temporal image stream formed of an illumination plane passing over a 3-dimensional object of interest is more generally sparse than anticipated by methods of FIG. 2A; the image signal being sparse and/or compressible, not only with respect to the row dimension of the signal X, but also with respect to columns and with respect to time. In other words, adjacent columns j of X are likely to be very similar, i.e. highly correlated with each other. Likewise, the image signal X is typically very similar from one frame time to another. A frame time may be, for example, a time period in which M samples are obtained for each of the columns of the image signal.

FIG. 2B shows computations of a vision system, similar to that of FIG. 2A, except that the random basis function Θ and sampling function Φ are partitioned into multiple independent segments, and these segments are used in a spatiotemporally interleaved fashion. Preferably, and in some embodiments, the spatiotemporally interleaving guarantees that, in any given frame time t, no column j of the image is sampled with the same pattern as either of its spatial neighbors j−1 or j+1 and that the sampling pattern used in the current frame-time is different from the sampling pattern of the previous frame time and the sampling pattern of the next frame time.

As compared to FIG. 2A, the computations outlined in FIG. 2B show, what may be thought of as, 9 smaller sampling functions used over 3 frame times, 3 sampling functions being applied concurrently to X at any given time t. In practice this method allows the number of samples M per frame-time t to be reduced relative to the methods outlined in FIG. 2A, while maintaining the same error tolerance associated with the binary ε-stable embedding of the signal Z, and thereby providing for significantly more computational efficiency relative to the vision system of FIG. 2A.

Although FIG. 2B shows the use of both spatial and temporal interleaving of the sampling function, in alternative embodiments, however, use of sampling functions may be interleaved in space only, or in time only.

In the process outlined in FIG. 2B:

The symbol $X_t$, $X \in \mathbb{R}^{N_1 \times N_2}$, represents an image intensity signal as it exists on the $N_1$ pixel rows and $N_2$ pixel columns of the pixel array at time t.

The symbol Ψ, $\Psi \in \{-1, 0, 1\}^{N_1 \times N_1}$, represents an image filtering function comprised of, and in some embodiments consisting of, coefficients used to compute a central difference approximation of the partial first derivative.

The symbol $r \in \{-1, 0, 1\}^{N_3}$, represents a sparse random sequence, which in some embodiments is based on a Markov chain of order m, where m>1.

The symbol $\Theta_{h,k}$, $\Theta \in \{-1, 0, 1\}^{M \times N_1}$, h=(j %3+1), and k=(t %3+1) represents an array of random basis functions Θ, created by drawing row vectors from r.

The symbol $\Phi_{h,k}$, $\Phi \in \{-1, 0, 1\}^{M \times N_1}$ represents an array of image sampling function, formed from the product of the random basis $\Theta_{h,k}$ and the filtering function Ψ.

The symbol $Y_t$, $Y \in \{-1, 1\}^{M \times N_2}$ represents a measurement of the filtered image intensity signal at time t, formed from the product of the sampling function $\Phi_{1,k}$, $\Phi_{2,k}$ and $\Phi_{3,k}$, and the image signal $X_t$, quantized by sign(.) to two levels {−1, 1}.

The symbol $W_t$, $W \in \{-M \ldots M\}^{N_1 \times N_2}$, represents a estimate of the filtered image signal, formed from the product of the measurement $Y_t$ and the transpose of the random basis functions $\Theta_{1,k}$, $\Theta_{2,k}$ and $\Theta_{3,k}$ convolved by α.

The symbol $\hat{Z}_{t-1}$, $\hat{Z} \in \{-M \ldots M\}^{N_1 \times N_2}$, represents an estimate of the product of the original image signal X and the filtering function Ψ, formed from the sum of $W_t$, $W_{t-1}$ and $W_{t-2}$.

The symbol $\Delta_{t-1}$, $\Delta \in \{0, 1, 2 \ldots N_1\}^{P \times N_2}$ represents image offset parameters of the local signal extremes, i.e. the P relevant signal peaks of the signal Z on each column at time t−1.

Accordingly, as with the process of FIG. 2A, in block 255 the process of FIG. 2B receives information representative of light energy of a scene, and in block 256 the process iteratively generates vectors of a measurement of image intensity signals, based on the relative light energy of the image of the scene. As in the process of FIG. 2A, the functions provided by blocks 255 and 256 may be performed using an image sensor 251.

In the process of FIG. 2B, however, generation of the measurement is performed using a plurality of sampling functions. In the embodiment of FIG. 2B nine sampling functions are used, interleaved spatially and temporally. In some embodiments three different sampling functions are used at any frame-time t, with a prior frame time and a succeeding frame time using different sets of three sampling functions. The nine sampling functions, or information to generate the sampling functions, may be dynamically generated and/or stored in memory 291 of, or associated with, the image sensor.

In block 263 the process buffers a measurement $Y_t$ of the image signal X at frame time t. In most embodiments the measurement Y of the image signal is formed by circuitry of or associated with an image sensor and stored in memory of or associated with an image processor. In addition, operations of blocks 265-281, discussed below, may also be performed by circuitry of or associated with the image processor.

In block 265 the process computes partial estimates of the filtered image signal Z. In the embodiment of FIG. 2B, the estimate W is determined by taking the product of the transpose of the corresponding random basis function $\Theta_{h,k}$ and the measurement $Y_t$, with a new estimate W formed for each frame-time t.

In block 267 the process convolves the partial sums emitted by block 265 kernel α, which in addition to refining the estimate of the filtered image as described earlier, with respect to FIG. 2A, combines neighboring column vectors, such that each column vector is replaced by the sum of itself and its immediate neighbors on the left and right.

In block 279 the process combines the partial sums output by block 267 over the previous three frame times to form the final estimate of the filtered image signal Z at frame-time t−1, storing the result in block 280. As in FIG. 2A, parameters of the illumination plane are determined by the process in block 281, for example using a peak detection algorithm.

Figure 3:
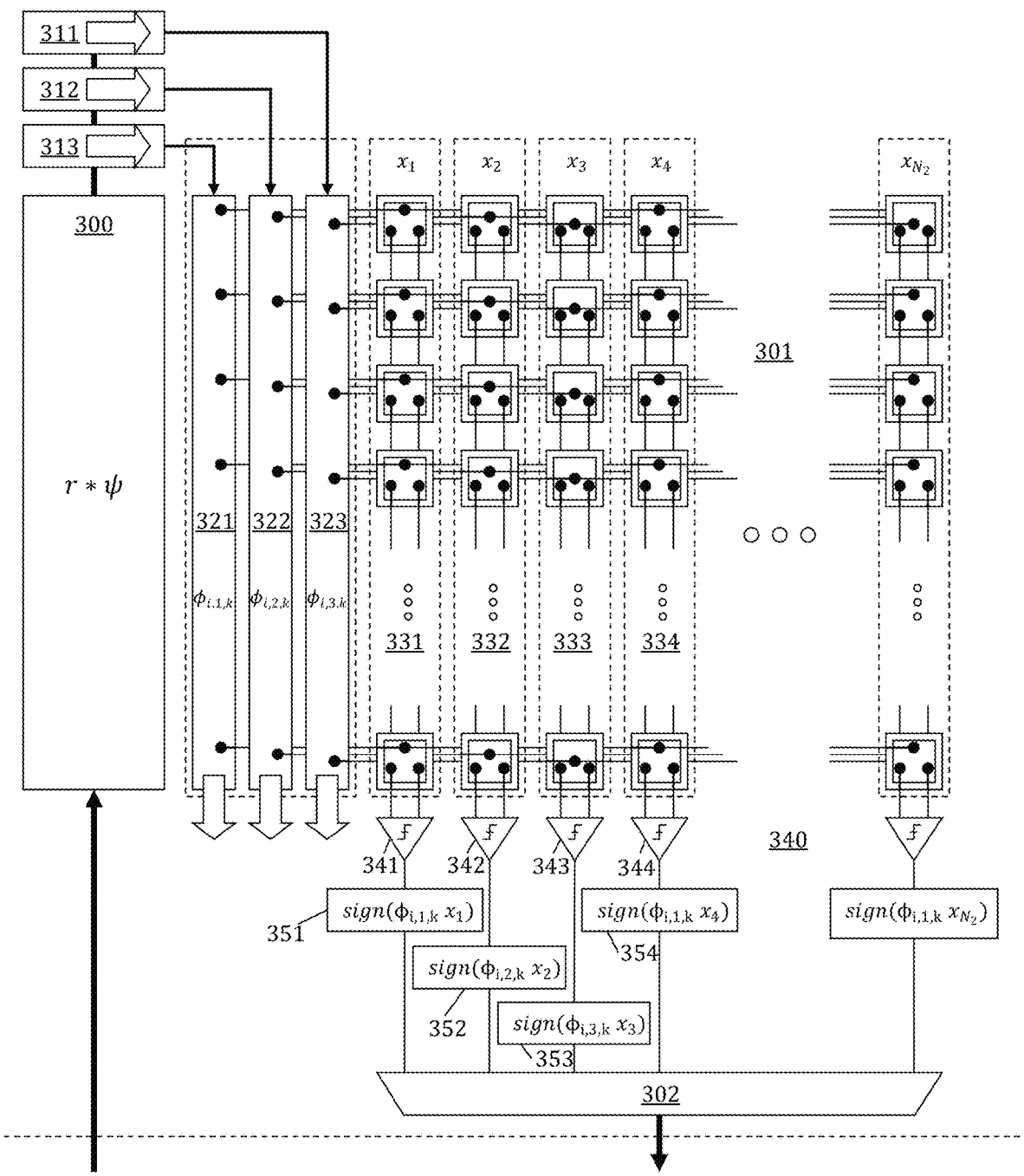
FIG. 3 is a high-level block-diagram of an image sensor architecture representative of certain aspects of the present invention.

FIG. 3 is a high-level block-diagram depicting an image sensor architecture representative of certain aspects of the present invention. The image sensor of FIG. 3 comprises: sampling function storage buffer 300; sampling function shift register input buffers 311,312,313; sampling function shift registers 321,322,323; pixel array 301 with pixel columns 331,332,333,334 included therein; analog signal comparator array 340, including analog signal comparators 341, 342,343, and 344; 1-bit digital output signal lines 351,352, 353,354; and output data multiplexer 302. Each of the pixel columns include a plurality of pixel elements. Generally each pixel element includes a radiation sensitive sensor (light sensitive in most embodiments) and associated circuitry.

Pixel elements of pixel array 301 accumulate photo-generated electrical charge at local charge storage sites. The photo-generated charge on the image sensor pixels may be considered an image intensity signal in some aspects. In some embodiments each pixel element includes a fixed capacitance that converts accumulated charge into a pixel voltage signal. Each pixel voltage signal controls a local current source, so as to provide for a pixel current signal. The pixel current source can be selected and switched, under the control of a sampling function, on to one of two signal output lines available per pixel column. Output lines are shared by all pixels on a column, such that each of the two current output signal formed on a column represent the summation of current supplied by selected pixels.

As may be seen from the use of the three sampling function shift registers, the embodiment of FIG. 3 is suited for use in a system implementing spatial interleaving (and spatio-temporal interleaving) as discussed with respect to FIG. 2B. The architecture of FIG. 3 may also be used for the non-interleaved embodiment of FIG. 2A, with either the three shift registers filled with identical information, or with the three shift registers replaced by a single register.

In some embodiments of the present invention the rows of the sampling function $\phi_i$ are dynamically formed from the contents of a memory buffer using shift registers. There are three different sampling function rows active at any time. Sampling function shift register 321, which contains $\phi_{i,1,k}$, provides the output control signals for all pixels in columns $\{1, 4, 7 \ldots\}$. Sampling function shift register 322, which contains $\phi_{i,2,k}$, provides the output control for all pixels in columns $\{2, 5, 8 \ldots\}$. Sampling function shift register 323, which contains $\phi_{i,3,k}$, provides the output control signals for all pixels in columns $\{3, 6, 9 \ldots\}$. In some embodiments of the present invention the sampling function storage buffer 300 is a digital memory buffer holding pixel controls signals, each pixel control signal consisting of 2-bits representing which, if any, of the two current output lines to be selected. In some embodiments the digital memory holding the control signals is accessed as words of 2(m)-bits in length, where m≥2(supp(ψ)). In some embodiments of the present invention m=16≥2(support(ψ)) and the memory data width is 32-bits.

To dynamically generate a new row i of the sampling functions, the image sensor of FIG. 3 copies 3 words from storage buffer 300 into shift register input buffers 311,312, 313 then causes the contents of the input buffers 311,312, 313 and the shift registers 321,322,323 to jointly shift m places. In some embodiments the sampling function shift registers 321,322,323 further comprise an $N_1$ element long shadow register to provide a means to maintain the state of the pixel control signals applied to pixel array 301 while the next shift operation occurs. In some embodiments of the present invention sampling function memory buffer 300 is accessed in a cyclical pattern such that the process of filling shift registers 321,322,323 with the first row need only be performed once, on power-up initialization.

Subsequent to initialization, new rows of the sampling function are formed and applied to pixel array 301 for each cycle of the shift register, thereby causing two new current output signals per column, indicative of the summation of selected pixels outputs, to form on the inputs of current comparator array 340. The two current outputs signals of a column are compared to form a 1-bit value that is representative of their relative magnitude. Column output bits, taken together, represent one row of digital output, and form a row vector of a measurement of image intensity signals on the image sensor pixels of the pixel array. Rows of digital output are multiplexed by multiplexer 302 into smaller words to form a digital output stream.

In operation M rows of 3 different sampling functions are generated for every frame time t to form a measurement matrix $Y_t$, in some embodiments consisting of M-bits for each of the $N_2$ columns of the pixel array. In accordance with FIGS. 2A and 2B, each bit of the measurement matrix $y_{i,j}$ can be thought of as the sign of the vector product of one column of the pixel array $x_{j,t}$ and one row of one of the sampling functions $\phi_{i,h,k}$, as previously explained with respect to FIG. 2B.

As noted earlier, one effect of the sign(.) quantization used in the forgoing equation is that the measurement is generally incapable of encoding the DC coefficient of the spatial frequencies present in the image signal. For this reason some embodiments of the present invention provide for multiple rows of dark pixels that can be configured to provide a prior known contribution to current output when selected by the sampling function. In this way we create an expectation that certain pixels in every column will have a known constant value in a fully recovered and properly scaled image signal. This allows for the computation of a scale factor, for each column, that can be derived from the ratio of the expected value to the reconstructed signal value. Multiple rows may be used because the noise in the reconstructed scale coefficient, which must be relatively low to avoid amplifying noise in the rescaling calculation, is reduced by a factor proportional to the square root of the number of rows carrying the scale information.

Figure 4:
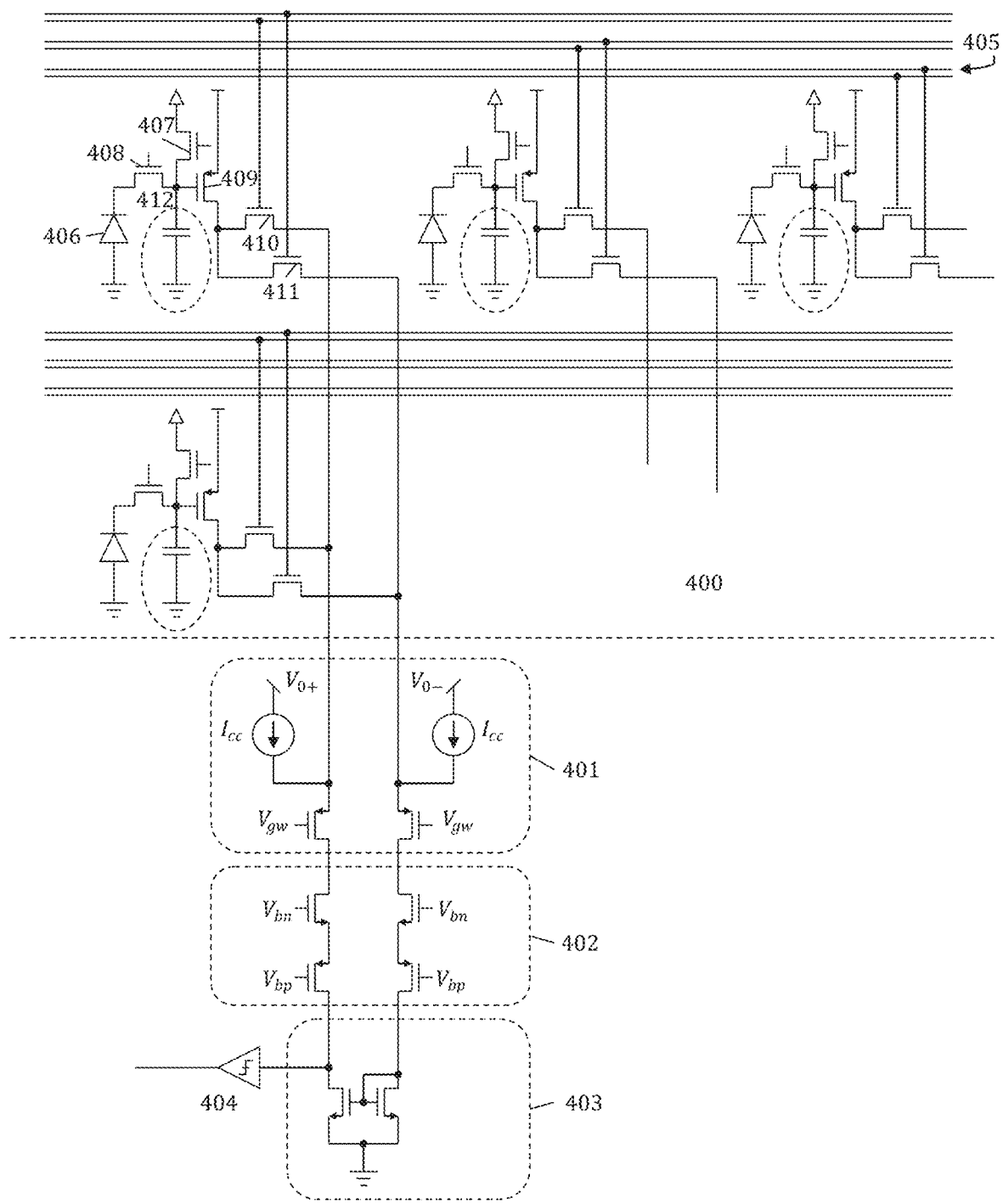
FIG. 4 is a circuit diagram showing more detailed aspects of an image sensor in accordance with aspects of the invention.

FIG. 4 is a circuit diagram showing more detailed aspects of portions of an image sensor in accordance with aspects of the invention. The portions of the image sensor of FIG. 4 are, in some embodiments, portions of the image sensor of FIG. 3. The embodiment of FIG. 4 includes a pixel array 400 (with only four elements of the pixel array shown for clarity), a current conveyor 401, a current limiter 402, a current mirror 403, a current comparator 404, pixel output control lines 405, a pinned photodiode 406, a reset transistor 407, a transfer gate 408, a transconductor 409, output select transistors 410, 411 and floating diffusion node 412.

In some embodiments each pixel comprises the pinned photodiode 406. The pinned photodiode can be reset through reset transistor 407, allowed to accumulate photo-generated electric charge for an exposure period, with the charge transferred to the floating diffusion node 412 through transfer gate 408 for temporary storage. The voltage at the floating diffusion node $V_{FD}$ controls tranconductor 409 to provide a current source that is proportional to the voltage signal. Depending on the state of pixel control lines 405, the current from a pixel can be switched through transistors 410 or 411 to one of two current output lines shared by all the pixels on a column. Conceptually, the column output currents represent the simple sum of the currents from selected pixels, but in practice there are additional factors. A more realistic estimate include offset and gain error introduced by readout circuitry blocks and the non-linearity error introduced by transconductor 409, as follows:

$$y_{i,j} = \text{sign}\left(\sum_{i=1}^{N_1} \phi_i(aV_{FD}(i,j)^2 + bV_{FD}(i,j) + c)\right)$$

where a, b and c are the coefficients of the second order adjustment for I=f($V_{FD}$), $V_{FD}$ being the voltage stored in the floating diffusion 412 of a pixel. The coefficients depend on the operation point of the transistor ($V_{dd}$, $V_{0+}$ and $V_{0-}$). Although the coefficients a, b and c are approximately equal for all pixels, some mismatch may need to be considered.

Voltages $V_{0+}$ and $V_{0-}$ of each column are fixed using both current conveyors. In some embodiments the current conveyor is based on a single PMOS transistor, where.

$$V_{0-} = V_{gw} + V_t + \sqrt{\frac{I_{CC} + I_-}{\beta}} \text{ and } V_{0+} = V_{gw} + V_t + \sqrt{\frac{I_{CC} + I_+}{\beta}}$$

Current conveyor 401 is biased with a current $I_{cc}$ to ensure the minimum speed necessary to fulfill the settling requirements. The positive and negative branches are balanced using a current mirror 403 and the sign is obtained using current comparator 404. A current limiter 402 is included to avoid break-off problems caused by image columns having an excessive number of bright pixels driving the column output lines.

Another aspect of the present invention is that rows of the measurement $Y_t$ may, in some embodiments, be formed concurrently with the temporal development of the image signal $X_t$ such that each row vector of the measurement $Y_t$ is representative of the instantaneous state of the image signal $Z_t$ as it is integrated in the pixels of the image sensor over the time interval between pixel reset and sampling. In most embodiments each element $y_{i,j}$ of the measurement Y is, effectively, normalized by the sign(.) function. However, given the relationship between signal and measurement vectors, as explained in the background of the invention, the measurement Y may be conceptualized as being based on the summation of M normalized signal vectors, as in the following:

$$y_{j,t} \sim \Phi \sum_{k=1}^{M} \frac{x_{j,t_k}}{\|x_{j,t_k}\|_2}$$

The conceptual formulation above suggests that the elements of the columns vectors of $Z_t$ will tend to preserve their relative relationship, in terms of magnitude, even after the intrinsic signal storage devices of the image sensor have become saturated. This behavior may be intuitively understood from the fact that some finite percentage of the measurement $Y_t$ is generated over a period of time when pixels of the image sensor are still operating in their linear range.

Figure 8:
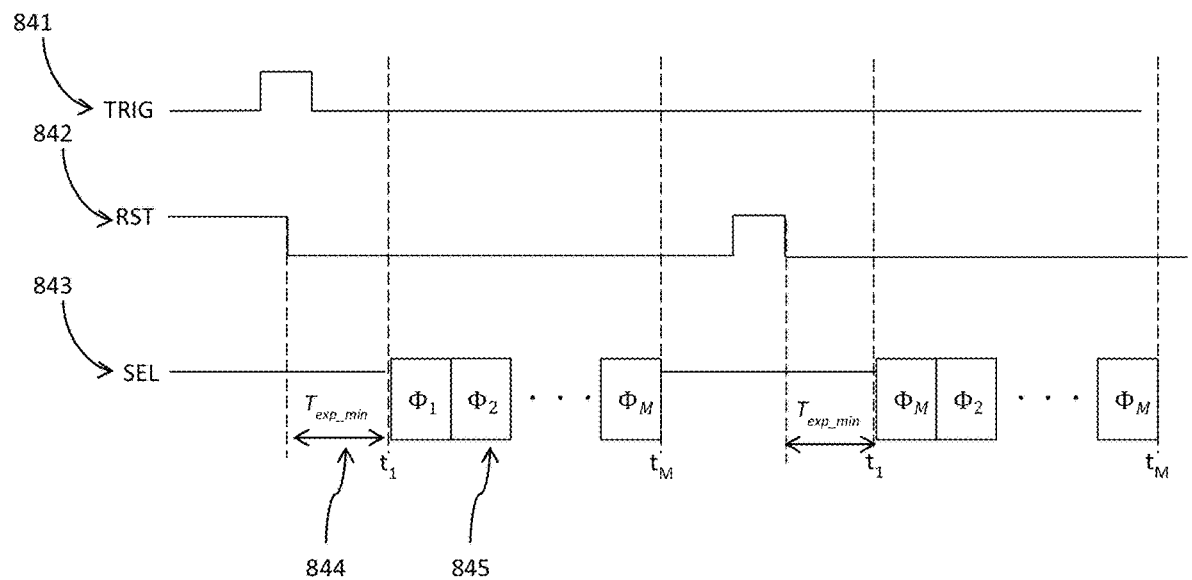
FIG. 8 is a timing diagram illustrating high sensor dynamic range acquisition in accordance with aspects of the invention.

FIG. 8 is a timing diagram illustrating extended dynamic-range acquisition in accordance with aspects of the invention. The timing diagram includes a trigger signal TRIG, 841, a reset signal RST, 842, and a selection signal SEL, 843. Once the photo-diode is reset, if the transfer gate of the photo-diode is kept active during M samples of a certain image, each vector of the sampling matrix Φ is applied to image signals associated with progressively higher exposure time.

The trigger signal indicates beginning of acquisition of images by a sensor. The reset signal resets floating diffusion nodes of pixels in the sensor. The selection signal selects output of selected pixels of the sensor. As illustrated in FIG. 8, the selection signal obtains M samples from various selected pixels, beginning at time $t_1$ and continuing to time $t_m$, 845. Time $t_1$ is generally somewhat after the reset signal goes low, to allow for sufficient exposure time, and hence charge accumulation time, for the pixel to obtain a valid response. This time requirement is denoted as the $T_{exp\_min}$, minimum exposure time, 844. The pixels remain exposed during the period from $t_1$ to $t_m$. Hence, generally during each succeeding sampling time, from 1 to m, the pixels have increased duration of exposure, effectively, increasing dynamic range of the sensor.

In some embodiments obtaining of sample and accumulation of charge may occur synchronously, for example as illustrated in the timing diagram of FIG. 8, with M samples for a measurement being obtained between applications of the reset signal. In other embodiments, obtaining the M samples for a measurement may be interrupted, with the reset signal applied during the period in which the M samples are obtained, and the charge accumulation period may be asynchronous to the period during which samples for a measurement are obtained.

Figure 5:
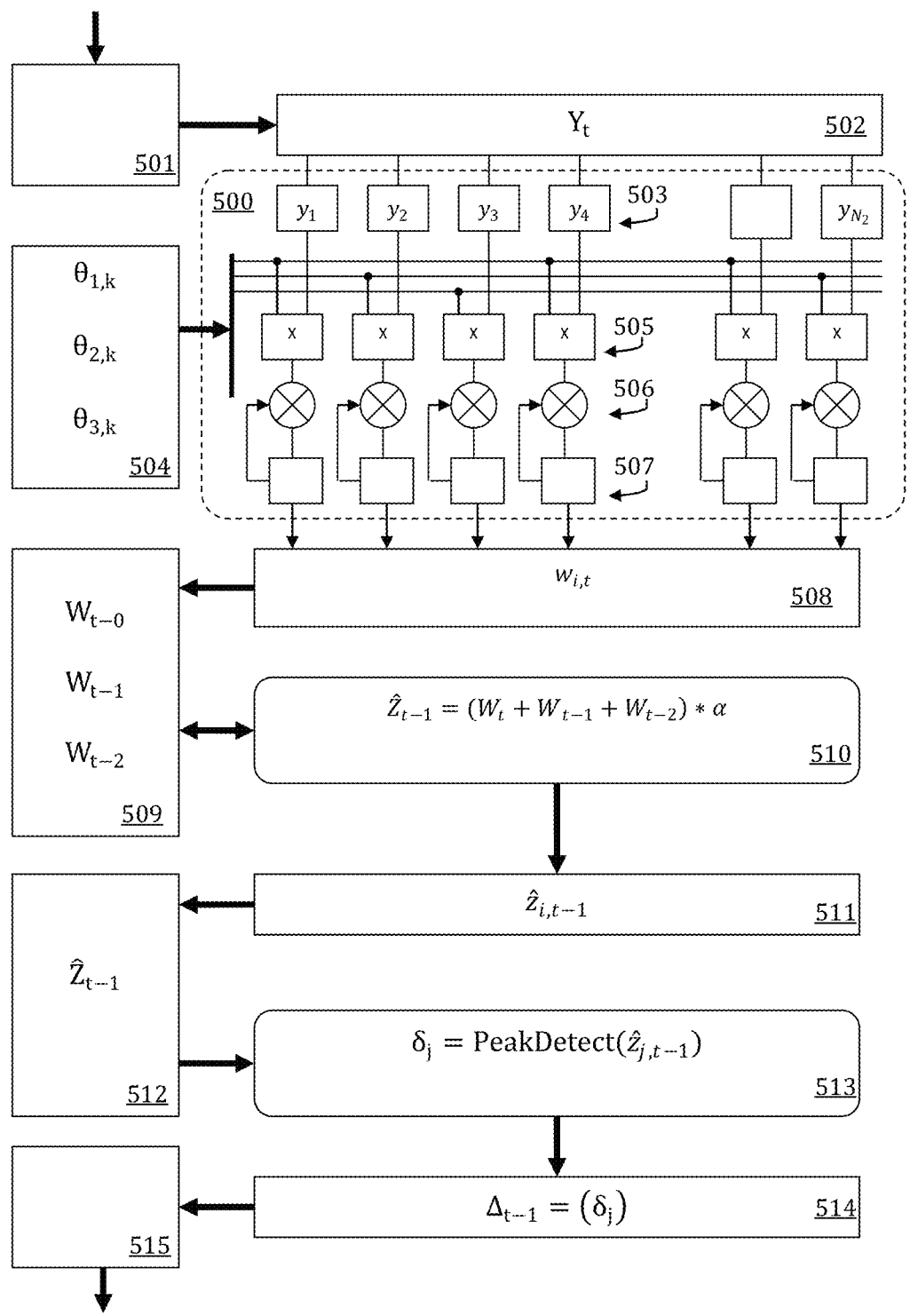
FIG. 5 is a block diagram of a processing architecture consistent with certain aspects of the present invention.

In some implementations of the present invention a parallel processing device, having architecture similar to that shown in FIG. 5, is provided to process the measurement stream. FIG. 5 is a block diagram of a processing architecture consistent with aspects of the present invention.

FIG. 5 includes measurement input buffer 501; measurement processing buffer 502; basis function buffer 504; matrix multiplier 500 including: measurement register 503, multipliers 505, summing junctions 506, and accumulation registers 507. Also included in the processor of FIG. 5, partial sum register 508; partial sum buffer 509; signal averaging processor 510; signal reconstruction row register 511; signal reconstruction row buffer 512; peak detection processor 513; signal parameter register 514 and output buffer 515.

In operation an incoming measurement stream is written to measurement input buffer 501. When a full frame-time measurement $Y_t$ is available in input buffer 501 it is transferred to measurement processing buffer 502. In the implementation considered here, rows of measurement bits are transferred from measurement buffer 502 to measurement processing buffer 503 one row at a time for processing. To form each element of $w_{i,t}$ in buffer 508, each bit of each column $y_j$ of the measurement Y in buffer 502 is multiplied by the corresponding bit of one column vector $\theta_{j,h,k}$ as follows:

$$w_{i,j,t} = \Sigma_{l=1}^{M} \theta_{l,i,h,k} y_{l,j,t}, \text{ where } h=j\%3+1 \text{ and } k=t\%3+1$$

The reconstructed signal row vector $\hat{z}_{i,t-1}$ in register 511 is formed in signal averaging processor 510 by summing $w_{i,t}$, the output of matrix multiplier 500, with the corresponding row from the two previous frame times $w_{i,t-1}$ and $w_{i,t-2}$, then convolving by the kernel α, as previously explained with respect to FIG. 2A and FIG. 2B. Methods for the efficient implementation of such image averaging functionality will be well known to those skilled in the art of high-speed digital image processing.

Peak detection processor 513 processes rows of the reconstructed signal stored in buffer 512 by estimating the offset parameters associated with the points of intersection of the illumination plane with objects of interest. Recall the reconstructed signal $\hat{Z}$ is an estimate of the original image signal X processed by the spatial filtering function Ψ, which, in some implementations, is a central difference approximation of the first derivative of the image signal with respect to rows. Known methods for extracting offsets from such a filtered image signal Z=ΨX include steps of finding and sorting local minimums and maximums found on each column of the reconstructed image, pairing neighboring min/max pairs to find points-of-interest, sorting points-of-interest on each column in order of differential magnitude, and forming the offset coordinate vector $\Delta \in \{1, 2, 3 \ldots N_1\}^{P \times N_2}$ from the P×$N_2$ row offset coordinates of those P points-of-interest. Additional steps may include interpolation to estimate sub-pixel parameters and pruning the set of coordinates to eliminate those point that are inconsistent with respect to a priori expectation relative to the surface of the object of interest. Methods for the efficient implementation of such peak detection functionality will be well known to those skilled in the art of machine-vision.

In some embodiments, a more accurate approximation of the signal Z can be formed based on the basis function Θ and the measurement Y.

Figure 7:
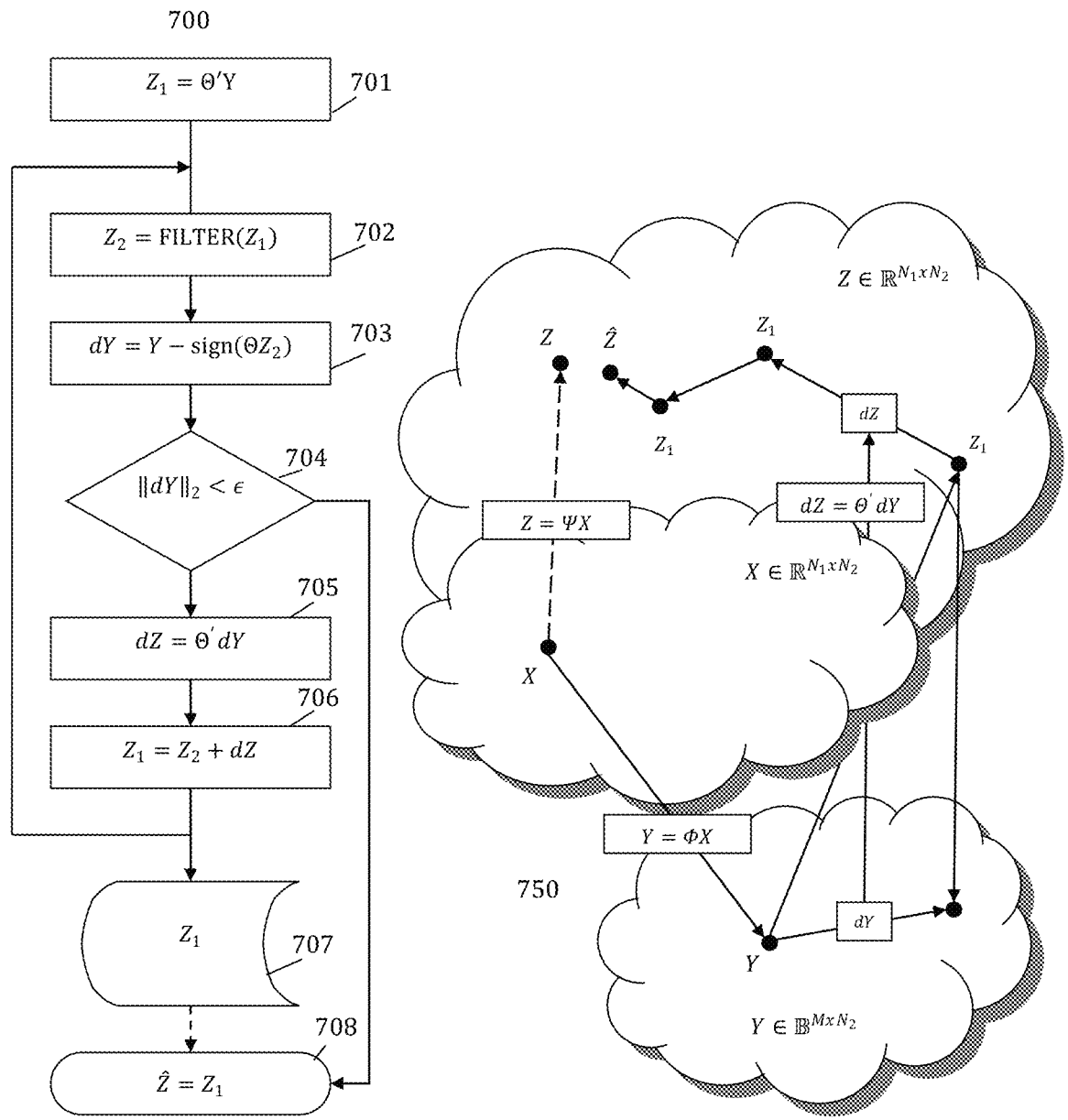
FIG. 7 is a diagram illustrating a method of forming approximations of an image signal in accordance with aspects of the invention.

FIG. 7 is a diagram showing a method for successively forming more accurate approximations of the image signal $\hat{Z}$. FIG. 7 includes flowchart 700 and explanatory illustration 750. Flowchart 700 includes: 701 initializing the reconstructed image buffer, 702 spatially filtering the reconstructed image, 703 computing a reconstruction error, 704 testing the reconstruction error, 705 computing a signal gradient, 706 forming a new reconstructed image in storage buffer 707, and 708 reading the final result from storage buffer 707.

The reconstruction method of flowchart 700 can be explained with the aid of illustrative drawing 750 as follows:
701. The original measurement vector Y is transformed from the measurement space to signal space to form a first approximation of the signal $Z_1$.
702. The first approximation of the signal $Z_1$ is filtered to form a second approximation $Z_2$ (not shown). The filtering comprising linear or nonlinear transformation of the signal intended to preserve the relevant information of the signal, while attenuating noise of the reconstruction.
703. The second approximation $Z_2$ is transformed back in to the measurement domain to form a second measurement vector that is subtracted from the original measurement vector Y to form a measurement gradient dY.
704. If the magnitude of the measurement gradient $\|dY\|_2$ is sufficiently small, the current first approximation of the signal $\hat{Z}=Z_1$ is reported as the best approximation of the signal Z.
705. Failing 704, the measurement gradient dY is transformed into signal space to form a signal gradient dZ.
706. The signal gradient dZ is added to the second approximation of the signal $Z_2$ to create a new first approximation of the signal $Z_1$ and the reconstruction process returns to step 702.

The method of flowchart 700 is based on a priori knowledge of the image signal Z, specifically the knowledge that the information content is small as compared to the dimension of the signal. The first approximation of the signal, as computed in 701, is assumed to comprise a sparse signal plus sampling noise and other noise assumed to increase the complexity. The filtering process of 702 is designed to restrict the signal approximation to the level of information content or sparseness that is anticipated in the original signal. Although the second signal approximation may have the same sparseness as the original signal, there is no guaranteed that it is actually close enough to the original signal to represent a sufficiently accurate approximation. Since the original signal Z is unknown there is no direct way to test the accuracy of the approximation $Z_2$. However, there is an indirect method, and that is to transform the approximation of the signal back into measurement space and compute the distance to the measurement vector, the measurement vector being known exactly. Since there is a known relationship between distance in measurement space and distance in signal space (as explained in the background of the invention) it can be inferred, from the gradient vector in measurement space, a gradient vector in signal space that, in effect, points in the direction of the original signal. By adding the signal gradient vector to the current approximation we form a new signal approximation that is closer to the original signal. The forgoing process of filtering, forming and applying gradients may be iterated until the measurement vector formed from the filtered image is sufficiently close to the actual measurement vector or until the gradient vector formed in the measurement space ceases to get smaller, indicating that the accuracy limits of the sampling function has been exceeded.

In the compressive sensing literature known methods similar to the above include BIHT (Binary Hard Thresholding), named in reference to the process of filtering the reconstructed signal by a method of zeroing all but K coefficients, where K is the known sparseness of the signal in a specific basis. Although this method of filtering may be effective, in practice it can be difficult to implement efficiently. In some applications, a simple median filter applied to $Z_1$ may fill the same role as more complicated methods of coefficient truncation, but it is more easily implemented and it does not depend on accurate knowledge of the sparseness K of the original image signal or the knowledge of (or a search for) a maximally compressive basis in which to apply the threshold process.

Note that the machine vision system 100 that includes image sensor 107 having a pixel array 400 can form a digital image 110 of a scene sparsely illuminated with an illumination plane, such that the formed digital image includes information about relative displacements of segments of an illumination profile within the digital image due to height discontinuities between various surfaces of the scene across portions thereof which are illuminated by the illumination plane, but lacks information about relative reflectivity of the illuminated portions of those surfaces. As noted earlier in this specification, the disclosed technologies can be modified, to form a digital image—that includes information about both (1) relative displacements of segments of an illumination profile within the digital image due to height discontinuities of corresponding illuminated portions of various surfaces in a scene, and (2) relative reflectivity of the illuminated portions of those surfaces—by using systems and techniques described below.

Figure 9A:
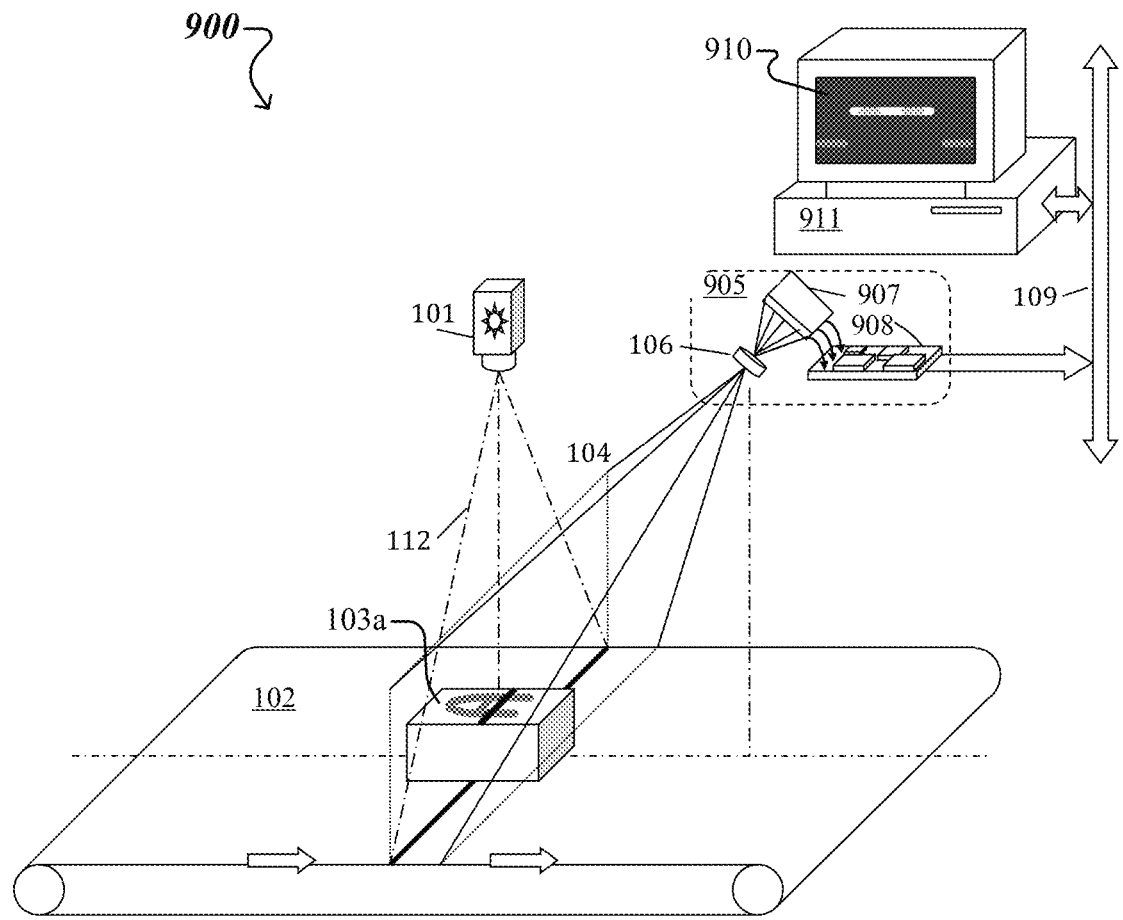
FIG. 9A shows another example of an implementation of a machine vision system in an operational environment.

FIG. 9A shows an example of an implementation of a machine vision system 900 in an operational environment. The machine vision system 900 is used to illuminate, with a plane of illumination 112, a 3D scene (or simply a scene) which includes an object of interest 103a placed on a conveyor 102, and to form a digital image of the scene illuminated in this manner. Further, the machine vision system 900 includes a laser-line generator 101 that forms the illumination plane 112. Furthermore, the machine vision system 900 contains a digital camera 905 including an imaging lens 106 and image sensor 907. The image sensor 907 includes a rectangular pixel array disposed in an image plane of the imaging lens 106. Additionally, the illumination plane 112 intersects the object of interest 103a and the conveyor 102 at an object plane 104 of the imaging lens 106. In this manner, the imaging lens 106 collects light scattered by the scene and focuses the scattered light on the pixel array of the image sensor 907.

Figure 9B:
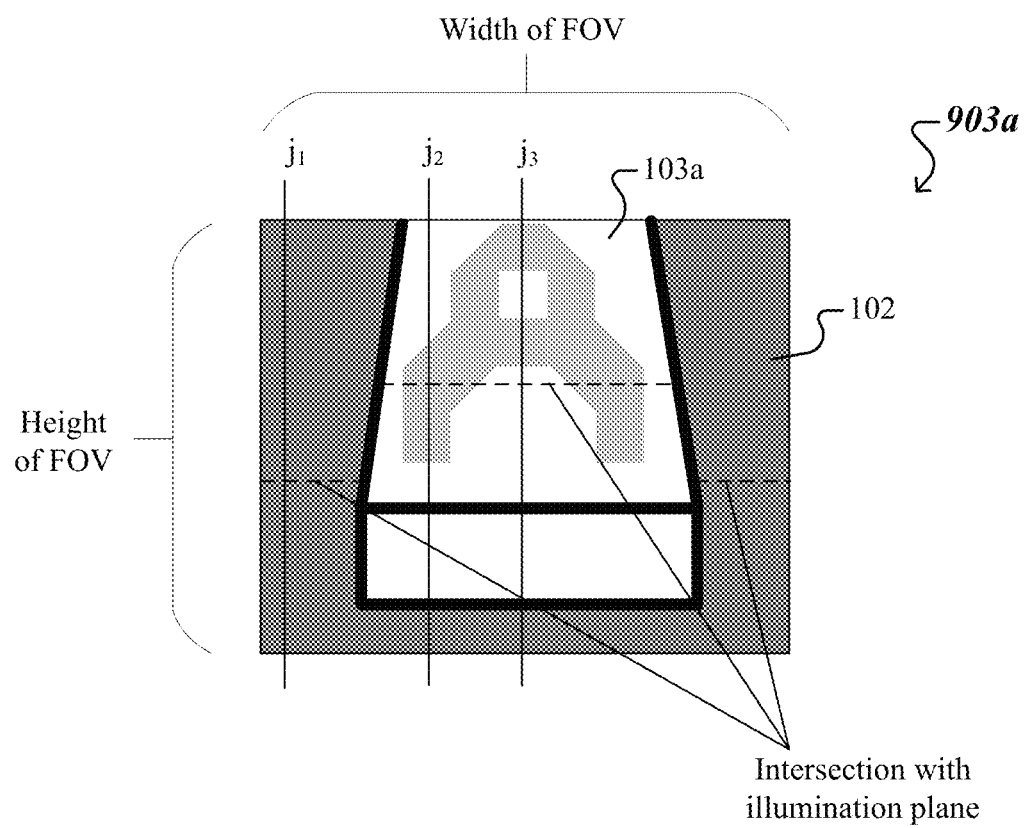
FIG. 9B shows structural aspects of a portion of a scene visible in a field of view of a camera of a machine vision system like the one illustrated in FIG. 9A.

FIG. 9B shows a portion 903a of the scene visible in the field of view of the camera 905, as if the scene were uniformly illuminated. Equivalently, FIG. 9B shows structural aspects of the visible scene portion 903a. As such, the visible scene portion 903a includes a portion of the conveyor 102 having a dark grey surface that is a low-efficiency light scatterer (e.g., a material of the conveyor is a strong light absorber). The visible scene portion 903a also includes a portion of the object 103a. Here, the object 103a has a finite (non-zero) height above the conveyor 102. Additionally, a top surface of the object 103a has white background that is a high-efficiency light scatterer, and light grey foreground (e.g., corresponding to a label printed on the top surface of the object) that is a medium-efficiency light scatterer. An intersection of the illumination plane 112 with the scene is denoted by a dashed line in the visible scene portion 903a illustrated in FIG. 9B. Here, the intersection appears as three segments, with a third segment stretching horizontally between and vertically offset from a first segment and a second segment. The first and second segments are the intersection of the illumination plane 112 with the conveyor 102, and the third segment is the intersection of the illumination plane with the object 103.

Referring again to FIG. 9A, the image sensor 907 receives an image signal, representative of an average light intensity signal formed by the imaging lens 106 over an exposure time period, and forms a binary measurement signal. The machine vision system 900 further includes a digital processor that has a portion 908 internal to the digital camera 905 and another portion 911 external to the digital camera. For example, the internal portion can be a local image processor 908, and the external portion can be a digital computer 911, such that the internal and external portions of the digital processor are communicatively coupled to each other through a digital communication channel 109. The digital processor 908/911 is configured to store and process the binary measurement signal to form and potentially display a digital image 910 corresponding to the visible scene portion 903a, when the latter is sparsely illuminated by an illumination plane 112. In the example illustrated in FIG. 9A, the digital image 910 includes displacement information in image coordinates that may be transformed, in accordance with calibration, into an object surface coordinate in the object plane 104, and information of intensity of the image of the scene that is illuminated by the illumination plane 112, the intensity information corresponding to the relative reflectivity of conveyor 102, the background and the foreground of object 103a.

Prior to describing detailed aspects of the images sensor 907 and of a technique to be implemented in the machine vision system 900 for obtaining the above-noted digital image 910, aspects of obtaining a digital image corresponding to the visible scene portion 903a by using the machine vision system 100 are described first.

Figure 10A:
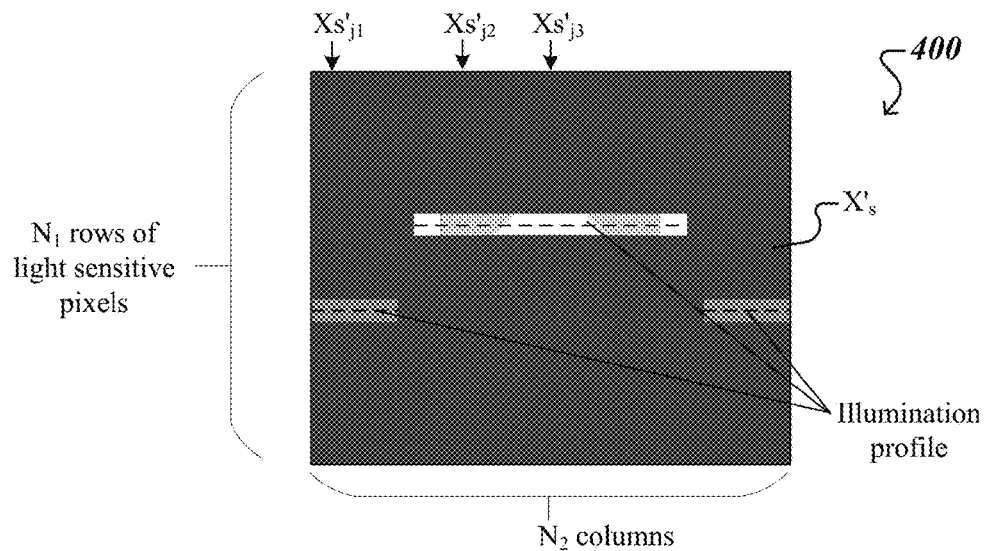
FIG. 10A shows aspects of an image signal received by a pixel array like the one illustrated in FIG. 4 when the scene illustrated in FIG. 9B is illuminated by an illumination plane.

FIG. 10A shows aspects of an image signal $X_S'$, received by the pixel array 400 illustrated in FIG. 4 (that can be part of the image sensor 107 of the machine vision system 100 illustrated in FIG. 1A), when the visible scene portion 903a illustrated in FIG. 9B is sparsely illuminated by an illumination plane 112. As described above in this specification, the pixel array 400 has $N_1$ rows and $N_2$ columns and includes light sensitive pixels arranged at intersections of the rows and the columns of the pixel array. As such, the image signal $X_S'$ is an $N_1 \times N_2$ array of values indicative of energy of light scattered to the light sensitive pixels of the pixel array 400 from corresponding points of the visible scene portion 903a illustrated in FIG. 9B. In this manner, as most of the visible scene portion 903a is dark (i.e., not illuminated by the illumination plane 112), most of the image signal $X_S'$ received by the pixel array 400 has low values (which are represented in FIG. 10A in black), referred to as background values. The three illuminated portions of the visible scene portion 903a correspond to three segments of an illumination profile within the image signal $X_S'$, which in this example, are oriented along the rows of the pixel array 400.

Figure 10B:
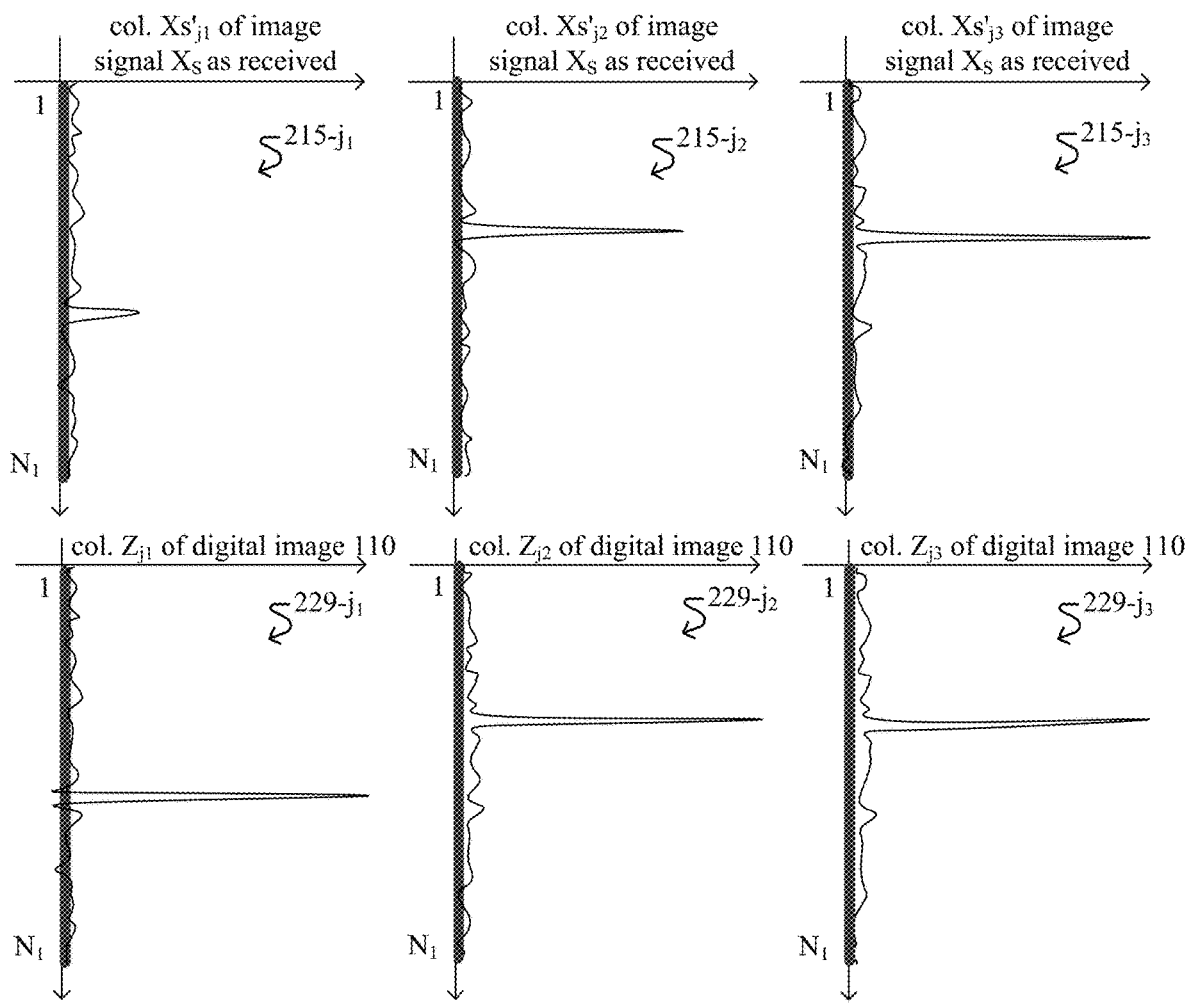
FIG. 10B shows aspects of an image signal like the one illustrated in FIG. 10A and aspects of a digital image formed based on the image signal when using techniques like the one illustrated in FIG. 2A.

Here, a first segment of the illumination profile and a second segment of the illumination profile within the image signal $X_S'$ are collinear and correspond to the first illuminated portion and the second illuminated portion of the conveyor 102. Values of the image signal $X_S'$ along the first segment of the illumination profile and the second segment of the illumination profile (are represented in FIG. 10A in dark grey and) are higher than the background values and are indicative of small energy of light scattered from the illuminated portions of the conveyor 102. For example, a column $Xs'_{j_1}$ of the image signal $X_S'$ (that corresponds to vertical strip $j_1$ of the visible scene portion 903a illustrated in FIG. 9B) intersects the first segment of the illumination profile and is represented in graph $215\text{-}j_1$ of FIG. 10B, such that the background values are about zero, and the image signal values corresponding to the illuminated portions of the conveyor 102 are about equal to ¼ of full scale. Further, a third segment of the illumination profile within the image signal $X_S'$ is between and displaced relative to the first segment of the illumination profile and second segment of the illumination profile and corresponds to the illuminated portion of the top surface of the object 103a. Some values of the image signal $X_S'$ along the third segment of the illumination profile (are represented in FIG. 10A in light grey and) are indicative of moderate energy of light scattered from the foreground of the top surface of the portions of the object 103a illuminated by the illumination plane 112. For example, a column $Xs'_{j2}$ of the image signal $X_S'$ (that corresponds to vertical strip $j_2$ of the visible scene portion 903a illustrated in FIG. 9B) intersects the third segment of the illumination profile and is represented in graph 215-$j_2$ of FIG. 10B, such that the background values are about zero, and the image signal values corresponding to the illuminated portions of the foreground of the top surface of the object 103a are about equal to ¾ of full scale. Some other values of the image signal $X_S'$ along the third segment of the illumination profile (are represented in FIG. 10A in white and) are indicative of high energy of light scattered from the background of the top surface of the portions of the object 103a illuminated by the illumination plane 112. For example, a column $Xs'_{j3}$ of the image signal $X_S'$ (that corresponds to vertical strip $j_3$ of the visible scene portion 903a illustrated in FIG. 9B) intersects the third segment of the illumination profile and is represented in graph 215-$j_3$ of FIG. 10B, such that the background values are about zero, and the image signal values corresponding to the illuminated portions of the background of the top surface of the object 103a are about equal to full scale.

The image signal $X_S'$ (illustrated in FIG. 10A), received as an input of the machine vision system 100, can be processed, e.g., in accordance with the technique disclosed above in connection with FIG. 2A, by the digital processor 108/111, to obtain a digital image $\hat{Z}$ 110. However, as noted above in this specification, one effect of the sign(.) quantization, used by the machine vision system 100 when performing the technique described above in connection with FIG. 2A, is that the obtained digital image 110 includes only information relating to position of the segments of the illumination profile within the image signal Xs', but lacks information relating to values of the illumination profile relative to the background values. For example, a column $\hat{Z}_{j1}$ of digital image $\hat{Z}$ 110, represented in graph 229-$j_1$, has a peak at the same location as the peak of the corresponding column $Xs'_{j1}$ of the image signal $X_S'$ represented in graph 215-$j_1$, however while an image signal value of the peak is equal to about ¼ of full scale in graph 215-$j_1$, the digital image value of the peak is equal to about full scale in graph 229-$j_1$. As another example, a column $\hat{Z}_{j2}$ of the digital image $\hat{Z}$ 110, represented in graph 229-$j_2$, has a peak at the same location as the peak of the corresponding column $Xs'_{j2}$ of the image signal $X_S'$ represented in graph 215-$j_2$, however while an image signal value of the peak is equal to about ¾ of full scale in graph 215-$j_2$, the digital image value of the peak is, once again, about equal to about full scale in graph 229-$j_2$. In the case of column $\hat{Z}_{j3}$ of the digital image $\hat{Z}$ 110, represented in graph 229-$j_3$, a peak thereof is at the same location as the peak of the corresponding column $Xs'_{j3}$ of the image signal $X_S'$ represented in graph 215-$j_3$, and, coincidentally, an image signal value of the peak in graph 215-$j_3$, is equal to about full scale as is the digital image value of the peak in graph 229-$j_3$.

In this manner, information in the image signal $X_S'$ relating to relative reflectivity of the surfaces of the visible scene portion 903a illuminated by the illumination plane 112 is lost when the digital image $\hat{Z}$ 110 is formed by the machine vision system 100 in accordance with the technique disclosed above in connection with FIG. 2A. However, the machine vision system 900, that includes an image sensor 907, can be used to implement a technique, described below in connection with FIG. 12, to receive an image signal corresponding to the visible scene portion 903a, sparsely illuminated by an illumination plane 112, and to form a digital image that preserves information relating to both position and intensity (i.e., image signal value) of segments of an illumination profile (corresponding to illuminated portions of the scene) within the image signal. Prior to describing the noted technique, the image sensor 907 is described in detail, next.

Figure 11:
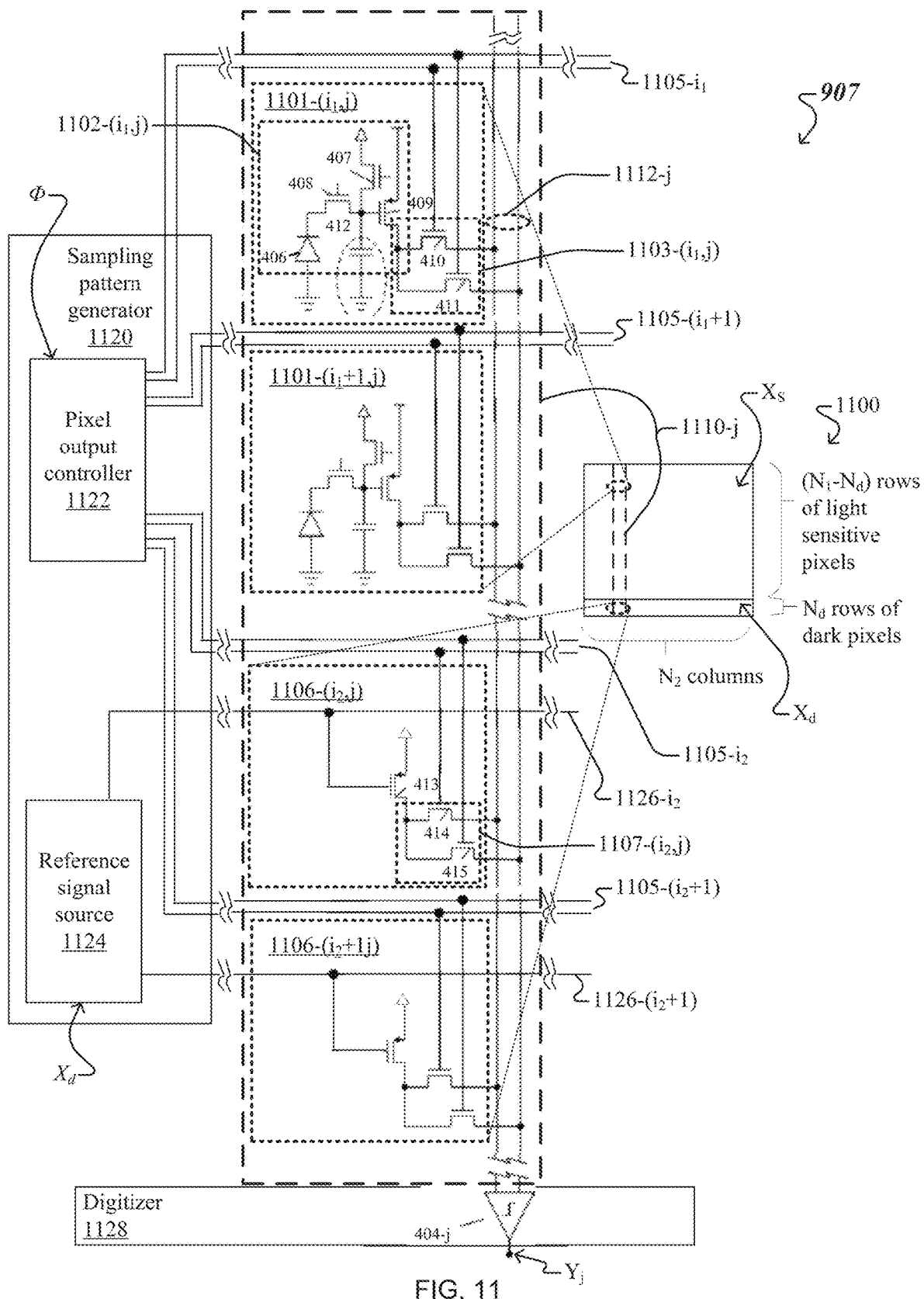
FIG. 11 shows an example implementation of an image sensor of a machine vision system like the one illustrated in FIG. 9A.

FIG. 11 shows an example of an implementation of an image sensor 907 of the machine vision system 900. The image sensor 907 is configured to receive an image signal Xs and output a binary measurement signal Y. For instance, the image signal Xs is indicative of energy of light scattered from the visible scene portion 903a, when the latter is sparsely illuminated by an illumination plane 112. In the example illustrated in FIG. 11, the image sensor 907 includes a pixel array 1100, a sampling pattern generator 1120 and a digitizer 1128.

Here, the pixel array 1100 is arranged by $N_1$ rows and $N_2$ columns. For example, the pixel array 1100 can have $N_1=512$ rows and $N_2=512$ columns or $N_2=768$ columns. The pixel array 1100 includes an array 1105 of $N_1$ pixel output control buses and an array 1110 of $N_2$ pixel column circuits. The $N_1$ pixel output control buses of the array 1105 are in one-to-one correspondence with the rows of the pixel array 1100. In this manner, each pixel output control bus 1105-$i$ is arranged and configured to provide an $i^{th}$ pixel output control signal to pixels on an $i^{th}$ row of the pixel array 1100, where $i=1 \ldots N_1$. In the example illustrated in FIG. 11, each pixel output control bus 1105-$i$ includes two conductors. In other implementations, the pixel output control bus 1105-$i$ can include one conductor or more than two conductors.

Moreover, the $N_2$ pixel column circuits of the array 1110 are in one-to-one correspondence with the columns of the pixel array 1100. Each pixel column circuit 1110-$j$ includes a pixel output bus 1112-$j$ for summing output signals, where $j=1 \ldots N_2$. In the example illustrated in FIG. 11, the pixel output bus 1112-$j$ includes two conductors. In other implementations, the pixel output bus 1112-$j$ can include one conductor or more than two conductors.

Additionally, each pixel column circuit 1110-$j$ includes a linear array of $N_1$ pixels coupled in one-to-one correspondence with the array of pixel output control buses 1105. The linear array of pixels includes a linear array 1101 of $(N_1-N_d)$ light sensitive pixels, and a linear array 1106 of $N_d$ dark pixels. In the example illustrated in FIG. 11, the linear array 1101 of $(N_1-N_d)$ light sensitive pixels corresponds to the first $(N_1-N_d)$ rows of the pixel array 1100, and the linear array 1106 of $N_d$ dark pixels corresponds to the last $N_d$ rows of the pixel array. In this manner, the pixel array 1100 is said to have $(N_1-N_d)$ rows of light sensitive pixels 1101-$(i_1,j)$, where $i_1=1 \ldots (N_1-N_d)$ and $j=1 \ldots N_2$, and $N_d$ rows of dark pixels 1106-$(i_2,j)$, where $i_2=(N_1-N_d+1) \ldots N_1$. Here, the number $N_d$ of rows of dark pixels is chosen to be a small fraction of the total number $N_1$ of rows of the pixel array 1100, e.g., $N_d/N_1=1/128$ or $1/32$ or $1/8$, for instance.

A light sensitive pixel labeled 1101-$(i_1,j)$ is part of the pixel column circuit 1110-$j$ and is arranged on the $i_1^{th}$ row of the pixel array 1100, where $i_1=1 \ldots (N_1-N_d)$ and $j=1 \ldots N_2$. Each light sensitive pixel 1101-$(i_1,j)$ includes a light signal source 1102-$(i_1,j)$ that is responsive to light energy received by the light sensitive pixel (which here is quantified as a coefficient $Xsi_{1,j}$ of the image signal Xs), and an output select circuit 1103-$(i_1,j)$, the latter coupled to a pixel output control bus 1105-$i_1$, to control coupling of the light signal source to the pixel output bus 1112-$j$ through which the light sensitive pixel provides a pixel output signal I-$(i_1,j)$ to the pixel output bus. Note that here the pixel output signal I-($i_1$,j) formed by the light sensitive pixel 1101-($i_1$,j) is proportional to the coefficient $Xsi_{1,j}$ of the image signal Xs, I-($i_1$,j)~$Xsi_{1,j}$. The light signal source 1102-($i_1$,j) includes a pinned photodiode 406, a reset transistor 407, a transfer gate 408, a transconductor 409, and a floating diffusion node 412. The pinned photodiode 406 can be reset through the reset transistor 407, allowed to accumulate photo-generated electric charge for an exposure period, with the charge transferred to the floating diffusion node 412 through the transfer gate 408 for temporary storage. A pixel voltage at the floating diffusion node $V_{FD}$ controls the transconductor 409 to provide a current source that is proportional to the pixel voltage. The output select circuit 1103-($i_1$,j) includes output select transistors 410, 411 connected to respective ones of the two conductors of the pixel output bus 1112-j. Depending on a state of the pixel output control bus 1105-$i_1$, the pixel output signal I-($i_1$,j), which here is the current formed by the transconductor-provided current source of the light signal source 1102-($i_1$,j), can be either coupled (also referred to as switched) through the output select transistors 410 or 411 to a respective one of the two conductors of the pixel output bus 1112-j, or decoupled from the pixel output bus.

A dark pixel labeled 1106-($i_2$,j) is part of the pixel column circuit 1110-j and is arranged on the $i_2^{th}$ row of the pixel array 1100, where $i_2=(N_1-N_d+1)\ldots N_1$ and $j=1\ldots N_2$. Each dark pixel 1106-($i_2$,j) includes a dark signal source 413 that is responsive to a reference signal $Xd_{i_2}$ received by the dark pixel, and an output select circuit 1107-($i_2$,j), coupled to a pixel output control bus 1105-$i_2$, to control coupling of the dark signal source to the pixel output bus 1112-j through which the dark pixel provides a pixel output signal I-($i_2$,j) to the pixel output bus. Note that here the pixel output signal I-($i_2$,j) formed by the dark pixel 1106-00 is proportional to the reference signal $Xd_{i_2}$, I-($i_2$,j)~$Xd_{i_2}$. The reference signal $Xd_{i_2}$ received by the dark pixel 1106-($i_2$,j), which here is a reference voltage, controls the dark signal source 413, which here is a transconductor, to provide a current source that is proportional to the reference voltage. The output select circuit 1107-($i_2$,j) includes output select transistors 414, 415 connected to respective ones of the two conductors of the pixel output bus 1112-j. Depending on a state of the pixel output control bus 1105-$i_2$, the pixel output signal I-($i_2$,j), which here is the current formed by the dark signal source 413, can be either coupled (also referred to as switched) through the transistors 414 or 415 to a respective one of the two conductors of the pixel output bus 1112-j of the pixel column circuit 1110-j, or decoupled from the pixel output bus.

In this manner, a current formed on the pixel output bus 1112-j represents a sum of the currents from selected light sensitive pixels of the linear array 1101 and from selected dark pixels of the linear array 1106, as described in more detail below.

The pixel array 1100 further includes an array of $N_d$ conductors 1126-$i_2$ in one-to-one correspondence with $N_d$ rows of dark pixels 1106-($i_2$,j), where $i_2=(N_1-N_d+1)\ldots N_1$ and $j=1\ldots N_2$. In this manner, each conductor 1126-$i_2$ is arranged and configured to provide a reference signal $Xd_{i_2}$ to $N_2$ dark pixels 1106-($i_2$,j) of an $i_2^{th}$ row from among the $N_d$ rows of dark pixels. Note that, here, substantially the same reference signal $Xd_{i_2}$ is provided to all $N_2$ dark pixels of the $i_2^{th}$ row within a variation $\Delta Xd$, i.e., $Xd_{i_2}-\Delta Xd \leq Xd_{i_2} \leq Xd_{i_2}+\Delta Xd$, where $\Delta Xd/Xd_{i_2}=0.5\%$, 1% or 2%, for instance.

Moreover, the sampling pattern generator 1120 includes a reference signal source 1124. In the example illustrated in FIG. 11, the reference signal source 1124 includes $N_d$ ports to which the $N_d$ conductors 1126-$i_2$ of the pixel array 1100 are coupled in one-to-one correspondence. In this manner, the reference signal source 1124 can provide the same reference signal to the $N_2$ dark pixels 1106 of each of the $N_d$ rows of dark pixels, e.g., $Xd_{N1-Nd+1}=\ldots=Xd_{N1}$, or different reference signals to the $N_2$ dark pixels 1106 of some or all of the $N_d$ rows of dark pixels, e.g., $Xd_{i_2} \neq Xd_{i_2+1}$. As another example, the reference signal source 1124 includes a single port to which the $N_d$ conductors 1126-$i_2$ of the pixel array 1100 are coupled in one-to-$N_d$ correspondence. In the latter example, the reference signal source 1124 provides the same reference signal to the $N_2$ dark pixels 1106 of each of the $N_d$ rows of dark pixels, e.g., $Xd_{N1-Nd+1}=\ldots=Xd_{N1}$. In the above examples, the reference signals of the $N_d$ rows of dark pixels are substantially the same within a variation ($Xd_{i_2}-Xd_{i_2'})/Xd_{i_2}=1\%$, 2% or 5%, for instance, where $i_2$ and $i_2'=(N_1-N_d+1),\ldots,N_1$.

Note that values of the $N_d$ reference signals $Xd_{i_2}$ provided by the reference signal source 1124 to the dark pixels of the $N_d$ rows of dark pixels are coefficients of a reference signal $X_d$ provided by the reference signal source to the pixel array 1100. Further note that a statistic of the reference signal $X_d$, e.g., mean($X_d$), median($X_d$), truncated mean($X_d$), and the like, is predetermined to be of the same order of magnitude as a statistic of the image signal Xs received by the light sensitive pixels 1101 of the pixel array 1100, e.g., mean($X_S$), median($X_S$) or truncated mean($X_S$), for instance.

Additionally, the sampling pattern generator 1120 further includes a pixel output controller 1122. The pixel output controller 1122 is coupled with the array 1105 of $N_1$ pixel output control buses and stores information of a sampling pattern matrix $\Phi$ having M rows and $N_1$ columns. Note that the sampling pattern matrix $\Phi$ is constructed such that adjacent rows $\Phi_i$, $\Phi_{i+1}$ thereof, where $i=1\ldots M$, are uncorrelated with each other (or, in some implementations, substantially uncorrelated with each other). Examples of sampling pattern matrices $\Phi$ have been described above in this specification in connection with FIGS. 2A-2B, 3 and 6. Moreover, the information of the sampling pattern matrix $\Phi$ is stored by the pixel output controller 1122 in a memory buffer thereof or in persistent storage medium associated with the sampling pattern generator 1120.

A row $\Phi_i$ of the sampling pattern matrix $\Phi$, where $i=1\ldots M$, is used by the pixel output controller 1122 to generate $N_1$ pixel output control signals to be provided substantially concurrently to respective $N_1$ pixel output control buses of the array 1105. In this manner, for a row $\Phi_i$, coefficient $\Phi_{i,j1}$ is used to generate a pixel output control signal to be provided to the pixel output control bus 1105-$i_1$, where $i_1=j_1=1\ldots(N_1-N_d)$, coefficient $\Phi_{i,j1+1}$ is used to generate a pixel output control signal to be provided to the pixel output control bus 1105-($i_1$+1), and so on, coefficient $\Phi_{i,j2}$ is used to generate a pixel output control signal to be provided to the pixel output control bus 1105-$i_2$, where $i_2=j_2=(N_1-N_d+1)\ldots N_1$, coefficient $\Phi_{i,j2+1}$ is used to generate a pixel output control signal to be provided to the pixel output control bus 1105-($i_2$+1), and so on. The pixel output controller 1122 can be implemented as an application-specific integration circuit (ASIC), or another type of state-machine that (i) generates the $N_1$ output control signals from the stored information of the sampling pattern matrix $\Phi$, and (ii) provides the generated output control signals to the respective $N_1$ pixel output control buses of the array 1105 using, e.g., one or more shift register input buffers, similar to the ones described above in connection with FIG. 3.

Coefficients of the sampling pattern matrix Φ have values of +1, 0 or −1, and determine a state of the array 1105 of pixel output control buses in the following manner. For a row $\Phi_i$ of the sampling matrix Φ, where i=1 . . . M, if a value of coefficient $\Phi_{i,j1}$ is +1, then the pixel output controller 1122 provides a first pixel output control signal, through a pixel output control bus 1105-$i_1$, where $i_1$=$j_1$=1 . . . ($N_1$−$N_d$), to the light sensitive pixels 1101-($i_1$,1), . . . , 1101-($i_1$,$N_2$) that are coupled with the pixel output control bus 1105-$i_1$, such that the provided first pixel output control signal causes coupling of a pixel output signal I-($i_1$,j)—formed by the light signal source 1102-($i_1$,j) of each light sensitive pixel 1101-($i_1$,j)—through the output select transistor 410, to a first of the two conductors of the respective pixel output bus 1112-j, where j=1 . . . $N_2$. Also, if a value of coefficient $\Phi_{i,j2}$ is +1, then the pixel output controller 1122 provides the first pixel output control signal, through a pixel output control bus 1105-$i_2$, where $i_2$=$j_2$=($N_1$−$N_d$+1) . . . $N_1$, to the dark pixels 1106-($i_2$,1), . . . , 1106-($i_2$,$N_2$) that are coupled with the pixel output control bus 1105-$i_2$, such that the provided first pixel output control signal causes coupling of a pixel output signal I-($i_2$,j)—formed by the dark signal source 413 of each dark pixel 1106-($i_2$,j)—through the output select transistor 414, to the first of the two conductors of the respective pixel output bus 1112-j, where j=1 . . . $N_2$.

Further, if a value of coefficient $\Phi_{i,j1}$ is −1, then the pixel output controller 1122 provides a second pixel output control signal, through the pixel output control bus 1105-$i_1$, where $i_1$=$j_1$=1 . . . ($N_1$−$N_d$), to the light sensitive pixels 1101-($i_1$,1), . . . , 1101-($i_1$,$N_2$) that are coupled with the pixel output control bus 1105-$i_1$, such that the provided second pixel output control signal causes coupling of the pixel output signal I-($i_1$,j)—formed by the light signal source 1102-($i_1$,j) of each light sensitive pixel 1101-($i_1$,j)—through the output select transistor 411, to a second of the two conductors of the respective pixel output bus 1112-j. Also, if a value of coefficient $\Phi_{i,j2}$ is −1, then the pixel output controller 1122 provides the second pixel output control signal, through the pixel output control bus 1105-$i_2$, where $i_2$=$j_2$=($N_1$−$N_d$+1) . . . $N_1$, to the dark pixels 1106-($i_2$,1), . . . , 1106-($i_2$,$N_2$) that are coupled with the pixel output control bus 1105-$i_2$, such that the provided second pixel output control signal causes coupling of the pixel output signal I-($i_2$,j)—formed by the dark signal source 413 of each dark pixel 1106-($i_2$,j)—through the output select transistor 415, to the second of the two conductors of the respective pixel output bus 1112-j.

Furthermore, if a value of coefficient $\Phi_{i,j1}$ is zero, then the pixel output controller 1122 provides a third pixel output control signal, through the pixel output control bus 1105-$i_1$, where $i_1$=$j_1$=1 . . . ($N_1$−$N_d$), to the light sensitive pixels 1101-($i_1$,1), . . . , 1101-($i_1$,$N_2$) that are coupled with the pixel output control bus 1105-$i_1$, such that the provided third pixel output control signal causes decoupling of the pixel output signal I-($i_1$,j)—formed by the light signal source 1102-($i_1$,j) of each light sensitive pixel 1101-($i_1$,j)—from the respective pixel output bus 1112-j. Also, if a value of coefficient $\Phi_{i,j2}$ is zero, then the pixel output controller 1122 provides the third pixel output control signal, through the pixel output control bus 1105-$i_2$, where $i_2$=$j_2$=($N_1$−$N_d$+1) . . . $N_1$, to the dark pixels 1106-($i_2$,1), . . . , 1106-($i_2$,$N_2$) that are coupled with the pixel output control bus 1105-$i_2$, such that the provided third pixel output control signal causes decoupling of the pixel output signal I-($i_2$,j)—formed by the dark signal source 413 of each dark sensitive pixel 1106-($i_2$,j)—from the respective pixel output bus 1112-j.

In this manner, for each pixel column circuit 1110-j, where j=1 . . . $N_2$, pixel output signals I-($i_1$,j) and I-($i_2$,j) respectively formed by light sensitive pixels 1101-($i_1$,j) and dark pixels 1106-($i_2$,j), where $i_1$=1 . . . ($N_1$−$N_d$) and $i_2$=($N_1$−$N_d$+1) . . . $N_1$, are selectively switched to the first conductor of the pixel output bus 1112-j, if the first pixel output control signal (corresponding to $\Phi_{i,j1}$=$\Phi_{i,j2}$=+1, where i=1 . . . M, $j_1$=$i_1$ and $j_2$=$i_2$) is provided to their respective pixel output control buses 1105-$i_1$ and 1105-$i_2$; or to the second conductor of the pixel output bus, if the second pixel output control signal (corresponding to $\Phi_{i,j1}$=$\Phi_{i,j2}$=−1) is provided to their respective pixel output control buses; or are not switched to the pixel output bus, if the third pixel output control signal (corresponding to $\Phi_{i,j1}$=$\Phi_{i,j2}$=0) is provided to their respective pixel output control buses. As such, a differential signal $\Delta I_{ij}$—corresponding to a row $\Phi_i$ of the sampling pattern matrix Φ—is formed on the pixel output bus 1112-j of each pixel column circuit 1110-j as a sum of pixel output signals that are selectively switched on the first conductor of the pixel output bus, and a sum of pixel output signals that are selectively switched on the second conductor of the pixel output bus. This is mathematically equivalent to $\Delta I_{ij}$=($\Phi_{i,j1}|\Phi_{i,j2}$)(I-($i_1$,j)|I-($i_2$,j)). An array $\Delta I_i$ of differential signals $\Delta I_{i1}$, . . . , $\Delta I_{iN2}$ is formed in all $N_2$ pixel column circuits 1110-j, for a row $\Phi_i$ of the sampling pattern matrix Φ.

In the example illustrated in FIG. 11, the digitizer 1128 includes $N_2$ comparators 404-j in one-to-one correspondence with the $N_2$ pixel column circuits 1110-j of the pixel array 1100. Here, each comparator 404-j is coupled with the pixel output bus 1112-j of a respective pixel column circuit 1110-j to receive the differential signal $\Delta I_{ij}$—corresponding to the row $\Phi_i$ of the sampling pattern matrix Φ—as formed on the pixel output bus. The comparator 404-j binarizes the received differential signal $\Delta I_{ij}$ to output a one-bit value $Y_{ij}$ representing a sign of the differential signal $\Delta I_{ij}$. Thus, if the differential signal $\Delta I_{ij}$>0, Yij=+1, else if the differential signal $\Delta I_{ij}$<0, Yij=−1. This is mathematically equivalent to $Y_{ij}$=sign($\Delta I_{ij}$)=sign($\Phi_{i,j1}|\Phi_{i,j2}$)(I-($i_1$,j)|I-($i_2$,j))= sign($\Phi_{i,j1}|\Phi_{i,j2}$)($Xs_{i1,j}|Xd_{i2,j}$)), where i=1 . . . M, $j_1$=$i_1$=1 . . . ($N_1$−$N_d$), $j_2$=$i_2$=($N_1$−$N_d$+1) . . . $N_1$ and j=1 . . . $N_2$. Further, an array $Y_i$ of one-bit values $Y_{i1}$, . . . , $Y_{iN2}$ is output by all $N_2$ comparators 404-j of the digitizer 1128, for a row $\Phi_i$ of the sampling pattern matrix Φ.

Once the digitizer 1128 has output the array $Y_i$ of one-bit values based on pixel output control signals generated by the pixel output controller 1122 using row $\Phi_i$ of the sampling pattern matrix Φ, the pixel output controller uses the next row $\Phi_{i+1}$ of the sampling pattern matrix Φ to generate other $N_1$ pixel output control signals and provides them concurrently to the respective $N_1$ pixel output control buses of the array 1105. As the row $\Phi_{i+1}$ is uncorrelated with the previous row $\Phi_i$, the $N_1$ pixel output control signals generated using the row $\Phi_{i+1}$ also are uncorrelated with the previous $N_1$ pixel output control signals generated using the previous row $\Phi_i$. As such, in a manner similar to the one described above, a differential signal $\Delta I_{i+1,j}$—corresponding to the row $\Phi_{i+1}$ of the sampling pattern matrix Φ—is formed on the pixel output bus 1112-j of each pixel column circuit 1110-j as a sum of pixel output signals that are selectively switched on the first conductor of the pixel output bus, and a sum of pixel output signals that are selectively switched on the second conductor of the pixel output bus. Further, the comparator 404-j binarizes the differential signal $\Delta I_{i+1,j}$ to output a one-bit value $Y_{i+1,j}$ representing a sign of the differential signal $\Delta I_{i+1,j}$. Note that an array $\Delta I_{i+1,j}$ of differential signals $\Delta I_{i+1,1}$, . . . , $\Delta I_{i+1,N2}$ is formed in all $N_2$ pixel column circuits 1110-j, for the row $\Phi_{i+1}$ of the sampling pattern matrix Φ and, hence, an array $Y_{i+1}$ of one-bit values $Y_{i+1,1}, \ldots, Y_{i+1,N2}$ is output by all $N_2$ comparators 404-$j$ of the digitizer 1128, for the row $\Phi_{i+1}$ of the sampling pattern matrix $\Phi$. Moreover, the generating of the $N_1$ pixel output control signals using a row of the sampling pattern matrix $\Phi$, the concurrently applying the generated $N_1$ pixel output control signals to the $N_1$ pixel output control buses, the forming of the differential signal on the pixel output bus of each of the $N_2$ pixel column circuits are iterated M times, once for each of the M rows of the sampling pattern matrix $\Phi$.

Note that a differential signal $\Delta I_{ij}$, formed on a pixel output bus 1112-$j$ based on pixel output control signals generated by the pixel output controller 1122 using row $\Phi_i$ of the sampling pattern matrix $\Phi$, where i=1 . . . M and j=1 . . . $N_2$, is a measurement coefficient of a measurement signal $\Delta I$ having $M \times N_2$ measurement coefficients. Moreover, an array $\Delta I_i$ of $N_2$ differential signals is a row of the measurement signal $\Delta I$ corresponding to the row $\Phi_i$ of the sampling pattern matrix $\Phi$. As the measurement signal $\Delta I$ is obtained by transforming the image signal $X_S$, received by the light sensitive pixels 1101 of the pixel array 1100, using a non-identity transformation (as described above in connection with FIGS. 2A-2B, 3 and 6, or FIG. 11), the measurement signal $\Delta I$ is said to include information of the image signal $X_S$ represented in a non-canonical basis. Further, a one-bit value $Y_{i,j}$, that represents the sign of the foregoing measurement signal coefficient $\Delta I_{ij}$, is a binary measurement coefficient of a binary measurement signal Y having $M \times N_2$ binary measurement coefficients. As such, an array $Y_i$ of $N_2$ one bit-values is a row of the binary measurement signal Y corresponding to the row $\Phi_i$ of the sampling pattern matrix $\Phi$.

Once at least some of the binary measurement signal Y—corresponding to the image signal $X_S$ received by the light sensitive pixels 1101 of the pixel array 1100 over an exposure time period—has been buffered for further processing, at least the light sensitive pixels of the pixel array are reset, so another image signal can be received by the light sensitive pixels of the pixel array over a subsequent exposure time period. Then, if necessary, the image sensor 907 forms, as described above in connection with FIG. 11, another binary measurement signal from the received other image signal and a reference signal provided by the reference signal source 1124 to the dark pixels 1106 of the pixel array 1100.

Figure 12:
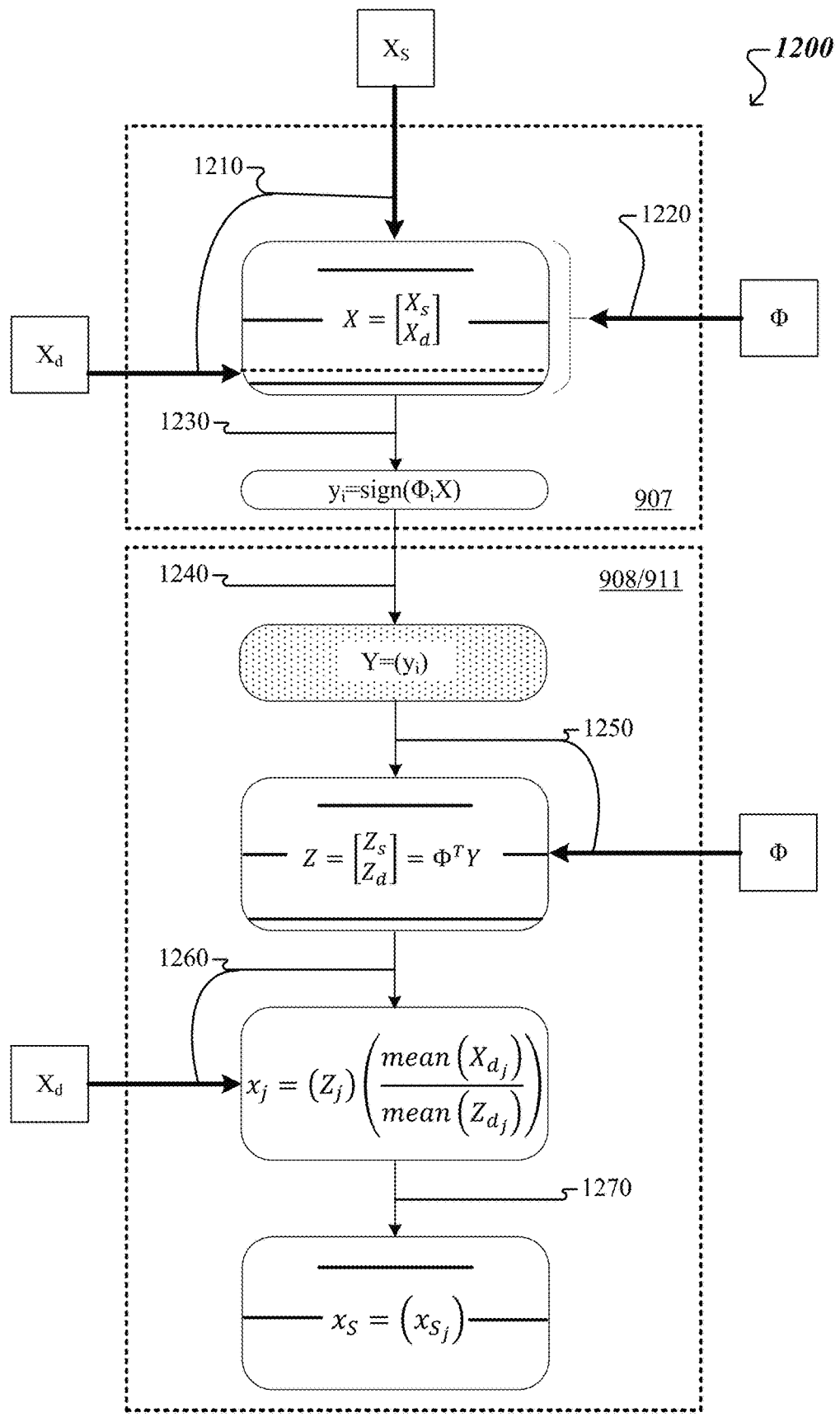
FIG. 12 shows a technique for forming a digital image from a pixel array input signal like the one illustrated in FIG. 13A using an image sensor like the one illustrated in FIG. 11.

FIG. 12 shows a technique 1200 for forming a digital image. For example, the technique 1200 can be implemented in the machine vision system 900 that uses the image sensor 907, described above in connection with FIG. 11, and the digital processor 908/911. At 1210, the image sensor 1100 receives a pixel array input signal X including (1) an image signal $X_S$ received by the light sensitive pixels 1101 of the pixel array, when the visible scene portion 903$a$ illustrated in FIG. 9B is sparsely illuminated by an illumination plane 112, and (2) a reference signal $X_d$ provided to the dark pixels 1106 of the pixel array by the reference signal source 1124.

Figure 13A:
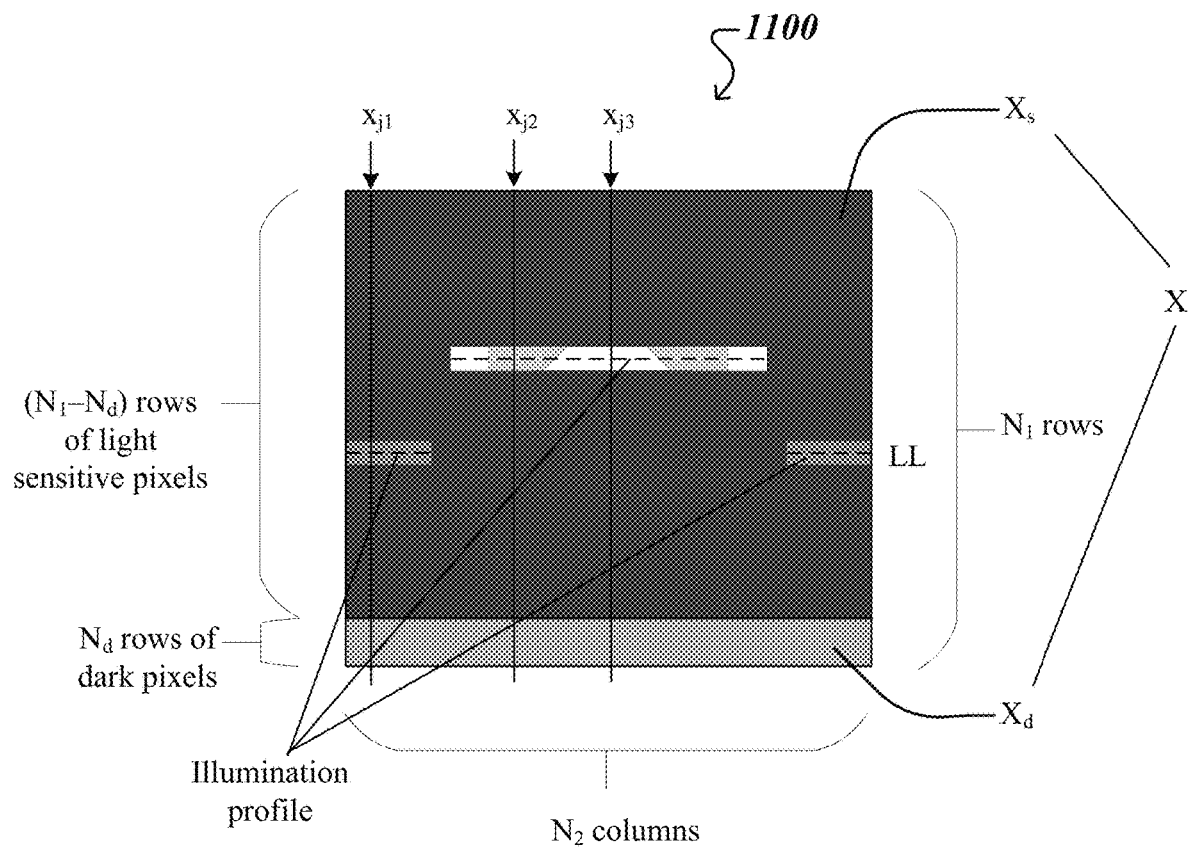
FIG. 13A shows aspects of a pixel array input signal received by a pixel array of an image sensor like the one illustrated in FIG. 11 when the scene illustrated in FIG. 9B is illuminated by an illumination plane.

FIG. 13A shows aspects of the pixel array input signal X. The image signal $X_S$ is an $(N_1-N_d) \times N_2$ array of coefficients indicative of energy of light scattered to the light sensitive pixels 1101 of the pixel array 1100 from corresponding points of the visible scene portion 903$a$, and the reference signal $X_d$ is an $N_d \times N_2$ array of coefficients. In this manner, as most of the visible scene portion 903$a$ illustrated in FIG. 9B is dark (not illuminated by the illumination plane 112), most of the image signal $X_S$ received by the light sensitive pixels 1101 of the pixel array 1100 has low values (which are represented in FIG. 13A in black), referred to as background values. Additionally, values of the reference signal $X_d$ (are represented in FIG. 13A in mid-range grey) are indicative of the fact that, here, a level of the reference signal $X_d$ provided by the reference signal source 1124 to the $N_d$ dark pixels 1106 of the pixel array 1100 has been chosen to be about in the middle of a range between the background values and the highest energy values of the image signal $X_S$.

The three illuminated portions of the visible scene portion 903$a$ illustrated in FIG. 9B correspond to three segments of an illumination profile within the image signal $X_S$, which in this example, are oriented along the rows of the pixel array 1100. Here, a first segment of the illumination profile and a second segment of the illumination profile within the image signal $X_S$ are collinear and correspond to the first illuminated portion and the second illuminated portion of the conveyor 102. Values of the image signal $X_S$ along the first segment of the illumination profile and the second segment of the illumination profile (are represented in FIG. 13A in dark grey and) are higher than the background values, but lower than the reference signal values, and are indicative of small energy of light scattered from the portions of the conveyor 102 illuminated by the illumination plane 112. For example, a column $X_{j1}$ of the pixel array input signal X (that corresponds to vertical strip $j_1$ of the visible scene portion 903$a$ illustrated in FIG. 9B) intersects the first segment of the illumination profile and the $N_d$ rows of dark pixels 1106 of the pixel array 1100, and is represented in graph 1315-$j_1$ of FIG. 13B, such that the background values are about zero, the image signal values corresponding to the illuminated portions of the conveyor 102 are equal to about ¼ of full scale, and the reference signal values corresponding to the $N_d$ dark pixels of the pixel array are equal to about ½ of full scale. Further, a third segment of the illumination profile within the image signal $X_S$ is between and displaced relative to the first segment of the illumination profile and the second segment of the illumination profile and corresponds to the illuminated portion of the top surface of the object 103$a$. Some values of the image signal $X_S$ along the third segment of the illumination profile (are represented in FIG. 13A in light grey and) are indicative of moderate energy of light scattered from the foreground of the top surface of the portions of the object 103$a$ illuminated by the illumination plane 112. For example, a column $X_{j2}$ of the pixel array input signal X (that corresponds to vertical strip $j_2$ of the visible scene portion 903$a$) intersects the third segment of the illumination profile and the $N_d$ rows of dark pixels 1106 of the pixel array 1100, and is represented in graph 1315-$j_2$ of FIG. 13B, such that the background values are about zero, the image signal values corresponding to the illuminated portions of the foreground of the top surface of the object 103$a$ are equal to about ¾ of full scale, and the reference signal values corresponding to the $N_d$ dark pixels of the pixel array are equal to about ½ of full scale. Some other values of the image signal $X_S$ along the third segment of the illumination profile (are represented in FIG. 13A in white and) are indicative of high energy of light scattered from the background of the top surface of the portions of the object 103$a$ illuminated by the illumination plane 112. For example, a column $X_{j3}$ of the pixel array input signal X (that corresponds to vertical strip $j_3$ of the visible scene portion 903$a$ illustrated in FIG. 9B) intersects the third segment of the illumination profile and the $N_d$ rows of dark pixels 1106 of the pixel array 1100, and is represented in graph 1315-$j_3$ of FIG. 13B, such that the background values are about zero, the image signal values corresponding to the illuminated portions of the background of the top surface of the object 103$a$ are equal to about full scale, and the reference signal values corresponding to the $N_d$ dark pixels of the pixel array are equal to about ½ of full scale.

Referring again to FIG. 12, at 1220, the pixel output controller 1122 uses information of a sampling pattern matrix $\Phi$ to generate, from a row $\Phi_i$ of the sampling pattern matrix $\Phi$, $N_1$ pixel output control signals, and concurrently provides the generated $N_1$ pixel output control signals to the $N_1$ pixel output control buses 1105 of the pixel array 1100, so as to form, through selective summing of pixel output signals on respective pixel output buses 1112 of the $N_2$ pixel column circuits 1110 of the pixel array, an array $\Delta I_i$ of $N_2$ measurement signal coefficients of the measurement signal $\Delta I$, where i=1 ... M. This is mathematically equivalent to $\Delta I_i \sim \Phi_i X$, where X is the pixel array input signal, that includes (as illustrated in FIG. 13A) the image signal $X_S$, as received, and the reference signal $X_d$, as provided by the reference signal source 1124. Hence, each of the measurement signal coefficients includes contributions from pixel output signals formed by light sensitive pixels 1101 based on the image signal $X_S$ and from pixel output signals formed by dark pixels 1106 based on the reference signal $X_d$. In this manner, the measurement signal $\Delta I$ includes information of the pixel array input signal X represented in a non-canonical basis.

At 1230, the $N_2$ comparators 404 of the digitizer 1128, which are coupled with the $N_2$ pixel output buses 1112, binarize the array $\Delta I_i$ of $N_2$ measurement signal coefficients of the measurement signal $\Delta I$ to form an array $Y_i$ of $N_2$ binary measurement coefficients of the binary measurement signal Y, where i=1 ... M. This is mathematically equivalent to $Y_i = \text{sign}(\Delta I_i) = \text{sign}(\Phi_i X)$. Note that the operations performed at 1220 and 1230 are iterated M times, one time for each row $\Phi_i$ of the sampling pattern matrix $\Phi$, to form M arrays $\Delta I_i$ of $N_2$ measurement signal coefficients of the measurement signal $\Delta I$ and their respective M arrays $Y_i$ of $N_2$ binary measurement coefficients of the binary measurement signal Y, where i=1 ... M.

Once an array $Y_i$ of $N_2$ binary measurement coefficients of the binary measurement signal Y has been formed by the digitizer 1128, at 1240, the image sensor 907 transmits the array $Y_i$ to the digital processor 908/911, and the digital processor buffers the received array $Y_i$ along with previously received arrays $Y_1, \ldots, Y_{i-1}$, where i=1 ... M. Upon receipt from the image sensor 907 of the last of the M arrays Yi, the entire binary measurement signal Y is said to have been buffered by the digital processor 908/911.

At 1250, the digital processor 908/911 retrieves (1) a column binary measurement vector $Y_j$, from the buffered binary measurement signal Y, corresponding to a column $X_j$ of the pixel array input signal X, and (2) information of the sampling pattern matrix $\Phi$, and finds, using (1) and (2), a portion of a column signal vector $Z_j$ of a signal Z that has a binary measurement space representation that is substantially correlated with the column binary measurement vector $Y_j$, where j=1 ... $N_2$. The latter correlation condition is mathematically equivalent to $\Phi Z_j \approx Y_j$, at least over a portion of $Z_j$. In this manner, the signal Z is an estimate of the pixel array input signal X, such that the signal Z includes a signal Zs that is an estimate of the image signal $X_S$, as received, and a signal $Z_d$ that is an estimate of the reference signal $X_d$ as provided by the reference signal source 1124.

In some implementations, the digital processor 908/911 can find the column signal vector $Z_j$ by multiplying a transpose $\Phi^T$ of the sampling pattern matrix by the column binary measurement vector $Y_j$, such that $Z_j = \Phi^T Y_j$. The accessing and the finding, at 1250, can be iterated $N_2$ times, once for each of the column binary measurement vectors $Y_j$ of the buffered binary measurement signal Y, to obtain the estimate signal Z. This is mathematically equivalent to $(Z_S | Z_d) = (\Phi_S | \Phi_d)^T Y$, where $\Phi_S$ is a partial sampling pattern matrix with $M \times (N_1 - N_d)$ coefficients used by the pixel output controller 1122 to provide pixel output control signals to the pixel output control buses 110541 corresponding to the $N - N_d$ rows of light sensitive pixels 1101-$(i_1, j)$, where $i_1 = 1 \ldots (N_1 - N_d)$ and j=1 ... $N_2$, and $\Phi_d$ is a partial sampling pattern matrix with $M \times N_d$ coefficients used by the pixel output controller to provide pixel output control signals to the pixel output control buses 1105-$i_2$ corresponding to the $N_d$ rows of dark pixels 1106-$(i_2, j)$, where $i_2 = (N_1 - N_d + 1) \ldots N_1$.

Note, however, that because sign(.) quantization is used by the digital processor 908/911 to determine the estimate signal Z, although the estimate signal Z includes information relating to (1) position in the pixel array input signal X of segments of an illumination profile within the image signal $X_S$ and of the reference signal $X_d$, and (2) the relative values of the illumination profile and the reference signal within each column signal vector $Z_j$, where j=1 ... $N_2$, the estimate signal Z lacks scale commonality between the $N_2$ column signal vectors $Z_j$, as explained next.

Figure 13B:
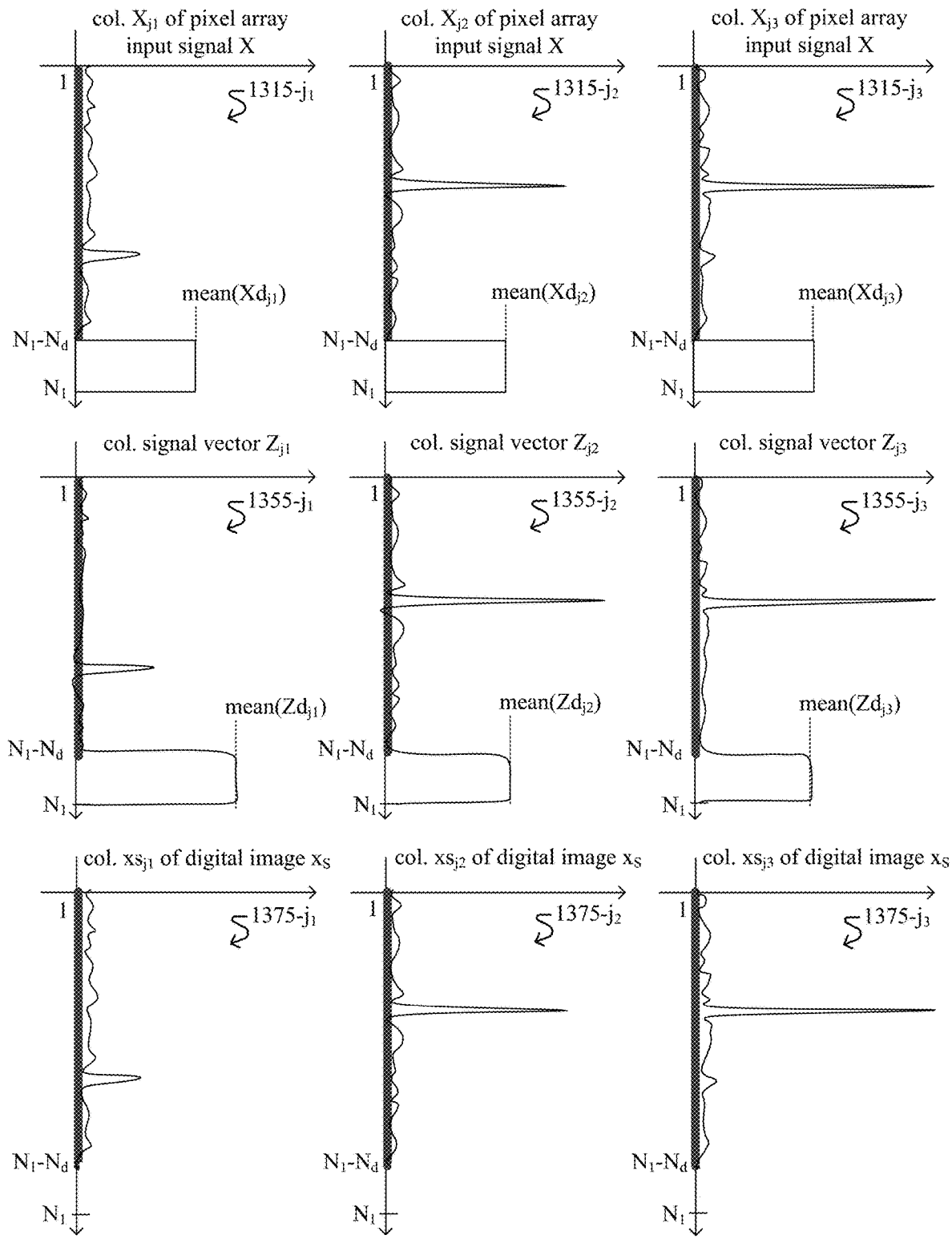
FIG. 13B shows aspects of a pixel array input signal like the one illustrated in FIG. 13A, aspects of an estimate signal formed based on the pixel array input signal, and aspects of a digital image formed based on the estimate signal when using a technique like the one illustrated in FIG. 12.

For example, a column signal vector $Z_{j1}$ of the estimate signal Z, represented in graph 1355-$j_1$ of FIG. 13B, has a peak and a plateau being located at the same respective locations as the peak of the image signal $X_S$ and the plateau of the reference signal $X_d$ of the corresponding column $X_{j1}$ of the pixel array input signal X represented in graph 1315-$j_1$, and a ratio of the peak to the plateau for the column signal vector $Z_{j1}$ corresponds to a ratio of the peak to the plateau for the column $X_{j1}$ of the pixel array input signal X. As another example, a column signal vector $Z_{j2}$ of the estimate signal Z, represented in graph 1355-$j_2$, has a peak and a plateau being located at the same respective locations as the peak of the image signal $X_S$ and the plateau of the reference signal $X_d$ of the corresponding column $X_{j2}$ of the pixel array input signal X represented in graph 1315-$j_2$, and a ratio of the peak to the plateau for the column signal vector $Z_{j2}$ corresponds to a ratio of the peak to the plateau for the column $X_{j2}$ of the pixel array input signal X. As yet another example, a column signal vector $Z_{j3}$ of the estimate signal Z, represented in graph 1355-$j_3$, has a peak and a plateau being located at the same respective locations as the peak of the image signal $X_S$ and the plateau of the reference signal $X_d$ of the corresponding column $X_{j3}$ of the pixel array input signal X represented in graph 1315-$j_3$, and a ratio of the peak to the plateau for the column signal vector $Z_{j3}$ corresponds to a ratio of the peak to the plateau for the column $X_{j3}$ of the pixel array input signal X. However, note that a scale of the column signal vector $Z_{j1}$, represented in graph 1355-$j_1$, a scale of the column signal vector $Z_{j2}$, represented in graph 1355-$j_2$, and a scale of the column signal vector $Z_{j3}$, represented in graph 1355-$j_3$, are different from each other, because a level mean($zd_{j1}$) of the plateau corresponding to the rows of dark pixels 1106 for the column signal vector $Z_{j1}$, a level mean($zd_{j2}$) of the plateau corresponding to the rows of dark pixels for the column signal vector $Z_{j2}$, and a level mean($zd_{j3}$) of the plateau corresponding to the rows of dark pixels for the column signal vector $Z_{j3}$, are different from each other, while a level of the plateau corresponding to the rows of dark pixels is the same for columns $X_{j1}$, $X_{j2}$, $X_{j3}$ of the pixel array input signal X, mean($Xd_{j1}$)=mean($Xd_{j2}$)=mean($Xd_{j3}$)=½ of full scale. Scaling of the column signals vectors $Z_{j1}$, $Z_{j2}$, and $Z_{j3}$, and generally of each of the column signal vectors $Z_j$ of the estimate signal Z, is performed next.

At 1260, the digital processor 908/911 processes a column signal vector Zj together with information on the reference signal $X_d$, provided to the dark pixels 1106, to form a digital pixel value of a digital image x that corresponds to and is scaled in the same manner as the pixel array input signal X. Here, the digital image x has $N_1 \times N_2$ image pixels. To form the digital image x, the digital processor 908/911 uses one or more coefficients $Zd_j$ of the column signal vector $Z_j$ corresponding to the dark pixels 1106 to determine a scale factor for the column signal vector $Z_j$, where $j=1 \ldots N_2$. In the example illustrated in FIG. 12, the scale factor is determined as $\text{mean}(Xd_j)/\text{mean}(Zd_j)$, where $Xd_j$ are levels of the reference signal provided by the reference signal source 1124 to the rows of dark pixels 1106 of the pixel array 1100, and $Zd_j$ are values of the coefficients of the column signal vector $Z_j$ that correspond to the rows of dark pixels of the pixel array. In this manner, one or more digital pixel values of a column $x_j$ of the digital image x are formed by multiplying the column signal vector $Z_j$ by the scaling factor, $x_j = Z_j * (\text{mean}(Xd_j)/\text{mean}(Zd_j))$. Note that the scaling performed at 1260 ensures that there is a common scale across the $N_2$ image pixel columns $x_j$ of the digital image x, for the following reasons: a mean of values $xd_j$ of the image pixels corresponding to the rows of dark pixels 1106 of any of the $N_2$ image pixel columns of the digital image x is determined to be $\text{mean}(xd_j) = \text{mean}(Zd_j) * (\text{mean}(Xd_j)/\text{mean}(Zd_j))$ or, equivalently, $\text{mean}(xd_j) = \text{mean}(Xd_j)$; however, $\text{mean}(Xd_j) = \text{constant}$ across the $N_2$ columns of pixel array input signal X, hence, $\text{mean}(xd_j) = \text{constant}$ across the $N_2$ columns of x. For this reason, the $N_2$ image pixel columns $x_j$ of the digital image x have a common scale.

At 1270, the digital processor 908/911 outputs a digital image $x_S$ that corresponds to the image signal $X_S$, as received at 1210, and is scaled in the same manner as the pixel array input signal X. Here, the digital image $x_S$ has $(N_1-N_d) \times N_2$ image pixels. Note that the digital image $x_S$ has numerical reference 910 in the machine vision system 900 illustrated in FIG. 9A. In some implementations, to output the digital image $x_S$, the digital processor 908/911 removes the last $N_d$ rows of image pixels from the digital image x formed at 1260.

Note that the digital image $x_S$—output at 1270 by the digital processor 908/911—closely resembles the image signal $X_S$ portion of the pixel array input signal X. For example, a column $xs_{j1}$ of the digital image $x_S$, represented in graph 1375-$j_1$, has a peak that is located at the same location and has the same level of about ¼ of full scale as the peak of the corresponding column $X_{j1}$ of the image signal $X_S$ portion of the pixel array input signal X represented in graph 1315-$j_1$. As another example, a column $xs_{j2}$ of the digital image $x_S$, represented in graph 1375-$j_2$, has a peak that is located at the same location and has the same level of about ¾ of full scale as the peak of the corresponding column $X_{j2}$ of the image signal $X_S$ portion of the pixel array input signal X represented in graph 1315-$j_2$. As yet another example, a column $xs_{j3}$ of the digital image $x_S$, represented in graph 1375-$j_3$, has a peak that is located at the same location and has the same level of about full scale as the peak of the corresponding column $X_{j3}$ of the image signal $X_S$ portion of the pixel array input signal X represented in graph 1315-$j_3$.

In accordance with the above disclosure, the machine vision system 900 can output a digital image $x_S$ 910 in which the digital pixel value associated with every pixel $xs_{i,j}$ thereof is related in, substantially, the same way to the light energy collected from a corresponding portion of a scene 903a, where $i=1 \ldots (N_1-N_d)$ and $j=1 \ldots N_2$. In contrast, the machine vision system 100 outputs a digital image $\hat{Z}$ 110 in which the digital pixel value associated with every pixel $\hat{Z}_{i,j}$ in a column $\hat{Z}_j$, where $i=1 \ldots N_1$ and $j=1 \ldots N_2$, is a single function of the light energy collected from a corresponding portion of a strip $y_j$ of the scene 903a, however, the function may vary. Here, the function may vary, from column $\hat{Z}_{j1}$ to column $\hat{Z}_{j2}$ and from the digital image $\hat{Z}$ 110 to another subsequently formed digital image $\hat{Z}'$ 110', according to the total light energy received by the individual columns.

Although the invention has been discussed with respect to various embodiments, it should be recognized that the invention comprises the novel and non-obvious claims supported by this disclosure.

What is claimed is:

1. A method useful in determining absolute image signal magnitude, the method comprising:
    forming a pixel output signal based on incoming light energy for each of a plurality of light sensitive pixel elements arranged in $(N_1-N_d)$ rows and $N_2$ columns in a pixel array, wherein each of the plurality of light sensitive pixel elements includes a light sensor, and the pixel output signals represent an image signal indicative of an image of a scene;
    forming a reference output signal on $N_d$ additional rows of dark pixels, each of the additional rows having $N_2$ dark pixels, wherein each of the dark pixels lacks a light sensor;
    obtaining a binarized measurement signal of the image signal by
        a) supplying M sets of $N_1$ control signals to the $(N_1-N_d)$ rows of the pixel array and the $N_d$ additional rows of the dark pixels, where $N_2$ light sensitive pixel elements of each row and $N_2$ dark pixels of each additional row share common control signals, each of the sets of control signals is representative of a different row of a sampling matrix, the $N_1$ control signals in each of the M sets being in one-to-one correspondence to the total $N_1$ rows, $(N_1-N_d)$ of which include light sensitive pixel elements and $N_d$ of which include dark pixels,
        b) for each of the M sets of control signals, selectively summing pixel output signals and reference output signals to obtain current output for each of the $N_2$ columns, and
        c) binarizing the current output for each of the $N_2$ columns to obtain the binarized measurement signal;
    computing a scale factor for each of the $N_2$ columns as a ratio of
        an expected reference signal value derived based on the sampling matrix and a prior known contribution to the current output of the reference output signal formed on the dark pixels, and
        a reconstructed reference signal value derived based on a portion corresponding to the dark pixels of a reconstructed signal, the reconstructed signal being the product of the sampling matrix transpose with the binarized measurement signal; and
    determining output pixel values by applying the scale factors computed for the $N_2$ columns to the reconstructed signal, the output pixel values comprising information of the image signal.

2. The method of claim 1, comprising:
    deriving the reconstructed reference signal value as a statistic of values of the reference output signal formed on the selected dark pixels; and deriving the expected reference signal value as a statistic of values of the dark pixels of a reconstructed signal.

3. The method of claim 2, wherein the statistics of values include one of a mean, a median, or a truncated mean.

4. The method of claim 1, wherein forming the reference output signal on $N_d$ additional rows of dark pixels comprises supplying reference signals to the $N_d$ additional rows of the dark pixels, where $N_2$ dark pixels of each additional row share common reference signals.

5. The method of claim 4, wherein supplying reference signals to the $N_d$ additional rows of the dark pixels comprises supplying the same reference signal to each of the $N_d$ additional rows of the dark pixels.

6. A system useful in determining absolute image signal magnitude, the system comprising:
   a plurality of light sensitive pixel elements arranged in $(N_1-N_d)$ rows and $N_2$ columns in a pixel array, wherein each of the plurality of light sensitive pixel elements includes a light sensor, and pixel output signals that represent an image signal indicative of an image of a scene are formable from the plurality of light sensitive pixel elements based on incoming light energy;
   $N_d$ additional rows of dark pixels, each of the additional rows having $N_2$ dark pixels, wherein each of the dark pixels lacks a light sensor, and a reference output signal is formable on the $N_d$ additional rows of dark pixels;
   a sampling pattern generator coupled with the plurality of light sensitive pixel elements and with the dark pixels, the sampling pattern generator configured to
   supply M sets of $N_1$ control signals to the $(N_1-N_d)$ rows of the pixel array and the $N_d$ additional rows of the dark pixels, where $N_2$ light sensitive pixel elements of each row and $N_2$ dark pixels of each additional row share common control signals, each of the sets of control signals is representative of a different row of a sampling matrix, the $N_1$ control signals in each of the M sets being in one-to-one correspondence to the total $N_1$ rows, $(N_1-N_d)$ of which include light sensitive pixel elements and $N_d$ of which include dark pixels, to thereby cause
   for each of the M sets of control signals, selective summing of pixel output signals and reference output signals to obtain current output for each of the $N_2$ columns;
   a digitizer coupled with the plurality of light sensitive pixel elements and with the dark pixels, the digitizer configured to binarize the current output for each of the $N_2$ columns to obtain a binarized measurement signal of the image signal; and
   a digital processor coupled with the digitizer to receive the binarized measurement signal of the image signal, the digital processor configured to
      compute a scale factor for each of the $N_2$ columns as a ratio of
         an expected reference signal value derived based on the sampling matrix and a prior known contribution to the current output of the reference output signal formed on the dark pixels, and
         a reconstructed reference signal value derived based on a portion corresponding to the dark pixels of a reconstructed signal, the reconstructed signal being the product of the sampling matrix transpose with the binarized measurement signal, and
      determine output pixel values by applying the scale factors computed for the $N_2$ columns to the reconstructed signal, the output pixel values comprising information of the image signal.

7. The system of claim 6, wherein the reconstructed reference signal value is derived as a statistic of values of the reference output signal formed on the selected dark pixels, and the expected reference signal value is derived as a statistic of values of the dark pixels of a reconstructed signal.

8. The system of claim 7, wherein the statistics of values include one of a mean, a median, or a truncated mean.

9. The system of claim 6, wherein the sampling pattern generator is configured to supply reference signals to the $N_d$ additional rows of the dark pixels, where $N_2$ dark pixels of each additional row share common reference signals, to form the reference output signal on the $N_d$ additional rows of the dark pixels.

10. The system of claim 9, wherein the sampling pattern generator is configured to supply the same reference signal to each of the $N_d$ additional rows of the dark pixels.

* * * * *